US008555149B2

(12) United States Patent
Pons et al.

(10) Patent No.: US 8,555,149 B2
(45) Date of Patent: Oct. 8, 2013

(54) SYSTEMS AND METHODS FOR PROTECTING DSL SYSTEMS AGAINST IMPULSE NOISE

(75) Inventors: Julien D. Pons, Carteret, NJ (US); Ravindra M Lambi, Old Bridge, NJ (US); Patrick Duvaut, Paris (FR); Massimo Sorbara, Freehold, NJ (US)

(73) Assignee: Ikanos Communications, Inc., Fremont, CA (US)

( * ) Notice: Subject to any disclaimer, the term of this patent is extended or adjusted under 35 U.S.C. 154(b) by 929 days.

(21) Appl. No.: 12/411,511

(22) Filed: Mar. 26, 2009

(65) Prior Publication Data

US 2009/0249133 A1 Oct. 1, 2009

Related U.S. Application Data

(60) Provisional application No. 61/039,740, filed on Mar. 26, 2008, provisional application No. 61/119,133, filed on Dec. 2, 2008.

(51) Int. Cl.
*G06F 11/00* (2006.01)

(52) U.S. Cl.
USPC ............................ 714/784; 714/748; 714/749

(58) Field of Classification Search
USPC ................................................. 714/784, 748
See application file for complete search history.

(56) References Cited

U.S. PATENT DOCUMENTS

| 5,581,228 A | 12/1996 | Cadieux et al. |
|---|---|---|
| 7,000,021 B1 | 2/2006 | Radhakrishnan et al. |
| 7,085,232 B1 | 8/2006 | Raissinia et al. |
| 2002/0158797 A1 | 10/2002 | Kelly et al. |
| 2003/0112860 A1 | 6/2003 | Erdogan |
| 2004/0123211 A1* | 6/2004 | Kozintsev et al. ............ 714/749 |
| 2005/0078690 A1 | 4/2005 | DeLangis |
| 2005/0111346 A1 | 5/2005 | Santhoff et al. |
| 2005/0120124 A1* | 6/2005 | Korhonen ..................... 709/231 |
| 2005/0286424 A1 | 12/2005 | Peeters et al. |
| 2007/0120958 A1 | 5/2007 | Sunahara |
| 2007/0168824 A1* | 7/2007 | Fukushima et al. .......... 714/748 |
| 2007/0198898 A1* | 8/2007 | Ysebaert et al. .............. 714/776 |
| 2007/0274215 A1* | 11/2007 | Gusat et al. ................... 370/235 |
| 2008/0052609 A1 | 2/2008 | Peng et al. |
| 2008/0063007 A1* | 3/2008 | Christiaens et al. .......... 370/458 |
| 2008/0165905 A1* | 7/2008 | Heise et al. ................... 375/346 |

(Continued)

OTHER PUBLICATIONS

Conexant, Infineon Ag, Infineon Na, 2-Wire, Nokia-Siemens, Ikanos, Aware, "G.inp: Proposed Protocol for Retransmission Above the Gamma Interface," Contribution C659, ITU-T SG 15, Feb. 11-23, 2008, Geneva, Switzerland.

(Continued)

*Primary Examiner* — Sarai Butler
(74) *Attorney, Agent, or Firm* — Pillsbury Winthrop Shaw Pittman LLP

(57) ABSTRACT

Systems and methods for protecting DSL systems against impulse noise are provided. Disclosed herein are example embodiments of a retransmission technique located above the gamma interface (i.e., in the network processing layer). Such a retransmission technique can be combined with standard RS coding with standard erasure-decoding & triangular interleaving at the PMS-TC layer. Example embodiments of the technique involve using the RS code to protect against REIN noise, and using γ-layer retransmission for protecting against error events not corrected by the RS code, e.g. a SHINE noise in the presence of REIN. Both techniques are used jointly in the case of combined REIN and SHINE noise.

20 Claims, 12 Drawing Sheets

(56) References Cited

U.S. PATENT DOCUMENTS

| | | |
|---|---|---|
| 2008/0209297 A1* | 8/2008 | Chandra et al. ............... 714/748 |
| 2009/0089638 A1 | 4/2009 | Heise et al. |
| 2009/0089641 A1 | 4/2009 | Schedelbeck et al. |
| 2009/0313517 A1 | 12/2009 | Schedelbeck et al. |
| 2010/0070817 A1 | 3/2010 | Heise |

OTHER PUBLICATIONS

Editor of VDSL2, "G.vdsl, G.adsl: Report of Ad Hoc Teleconference Call on INP," Jan. 31, 2007 Ad Hoc Report uploaded to the "Teleconference calls\07-01-31 INP" directory in the Napa Valley directory of the informal Q4 ftp site.

Broadcom, "ADSL:G.vdsl: Control parameters and performance of a retransmission scheme," Contribution C-0090, Oct. 2006, Geneva, Switzerland.

Broadcom, "G.ADSL/G.VDSL: Further results on retransmission," Contribution SD-042, San Diego, CA, Jan. 2007.

Broadcom, "G.ADSL/G.VDSL: Comparison of retransmission and interleaving," Contribution NC-063, Apr. 16-20, 2007, San Diego, CA.

Ikanos, "ADSL, G.vdsl: Comparison of impulse noise protection schemes," Contribution SD-023, Jan. 15-19, 2007, San Diego, CA.

Conexant, "G.gen (VDSL & ADSL): Questions and Issues Regarding Retransmissions at the DSL PHY Layer," SD-054, Jan. 15-19, 2007, San Diego, CA.

Texas Instrument, "G.vdsl2: Performance Reason for Interleaving on All Latency Paths", Contribution D-0327, May 16-27, 2005, Geneva, Switzerland.

Conexant, "G.vdsl, ADSL: Evaluation of Impulse Noise Protection Methods per the Test Cases in the Jan. 31, 2007 Teleconference Ad Hoc Report," Contribution NC-027, Apr. 16-20, 2007, Napa Valley, CA.

* cited by examiner

SYSTEMS AND METHODS FOR PROTECTING DSL SYSTEMS AGAINST IMPULSE NOISE

CROSS-REFERENCE TO RELATED APPLICATION

This application claims benefit to co-pending U.S. provisional application entitled, "Retransmission Technique above the Gamma Interface for Protecting DSL Systems against Impulse Noise," having Ser. No. 61/039,740, filed Mar. 26, 2008 and to U.S. provisional application entitled, "Proposed Framework for Retransmission Above the Gamma-interface," having Ser. No. 61/119,133, filed Dec. 2, 2008, which are both entirely incorporated by reference herein.

TECHNICAL FIELD

The present disclosure is generally related to electronics and, more particularly, is related to transmission techniques in digital subscriber line transmission.

BACKGROUND

The presence of impulse noise can occur in digital subscriber line (xDSL) systems due to electromagnetic interference from such sources as a telephone network, a power system, and even from natural phenomena such as thunderstorms and lightning. The presence of impulse noise can significantly limit the reliability of real-time services such as video that can be supported by current generation xDSL systems, for example, VDSL (Very High Speed DSL) and ADSL (Asymmetric Digital Subscriber Line). In particular, impulse noise can cause physical layer CRC (cyclic redundancy check) errors and loss of packets in xDSL systems, thereby affecting triple-play services such as IPTV. As the demand for these services increases and as telephone companies realize the added value in efficiently utilizing their local loops, robust designs for overcoming impulse noise sources are required.

SUMMARY

Various embodiments of the present disclosure are directed to systems and methods of protecting DSL systems against impulse noise. One embodiment is a protection apparatus in an xDSL system for mitigating the effects of repetitive electrical impulse noise (REIN) and a single high impulse noise event (SHINE) within a physical layer and network processing layer. The protection apparatus comprises a forward error correction (FEC) module, wherein the FEC module comprises a Reed-Solomon (RS) encoder-decoder and an interleaver-deinterleaver. The protection apparatus further comprises a retransmission module configured to request retransmission of corrupted data fragments within the data stream not corrected by the FEC module.

Another embodiment is a method that comprises classifying a plurality of packets as retransmit eligible or non-transmit eligible, queuing packets classified as retransmit eligible in a retransmit queue, receiving a retransmit request and either sending a retransmit response if the received retransmit request is for packets classified as retransmit eligible or sending a retransmit denial if the received retransmit request is for packets classified as non-transmit eligible or is for packets not present in the retransmit queue.

Another embodiment is a method that comprises storing received packet data fragments in a receiver queue, determining whether the received packet data fragments belong to a protected channel or an unprotected channel based on whether a lower processing layer supports multiple channels, and sending retransmission requests based on the presence of one or more of the following: retransmit-eligible packets, missing sequence identification (SID) numbers, and corrupted packets, wherein corrupted packets are determined based on a cyclic redundancy check (CRC). The method further comprises sending more than one retransmission request if a response is not received within a predetermined roundtrip time.

Another embodiment is a protection module in an xDSL system configured to mitigate the effects of noise that comprises a forward error correction (FEC) module comprising a Reed-Solomon (RS) encoder-decoder and an interleaver-deinterleaver. The protection apparatus further comprises a retransmission module configured to provide retransmission of corrupted data fragments within the data stream, wherein the FEC module mitigates a first noise and the retransmission module mitigates a second noise.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

DETAILED DESCRIPTION

Embodiments of the present disclosure are described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples. Embodiments described herein address the effects of impulse noise, particularly, repetitive electrical impulse noise (REIN) and single high impulse noise event (SHINE). Embodiments described herein address the effects of impulse noise.

Figure 1:
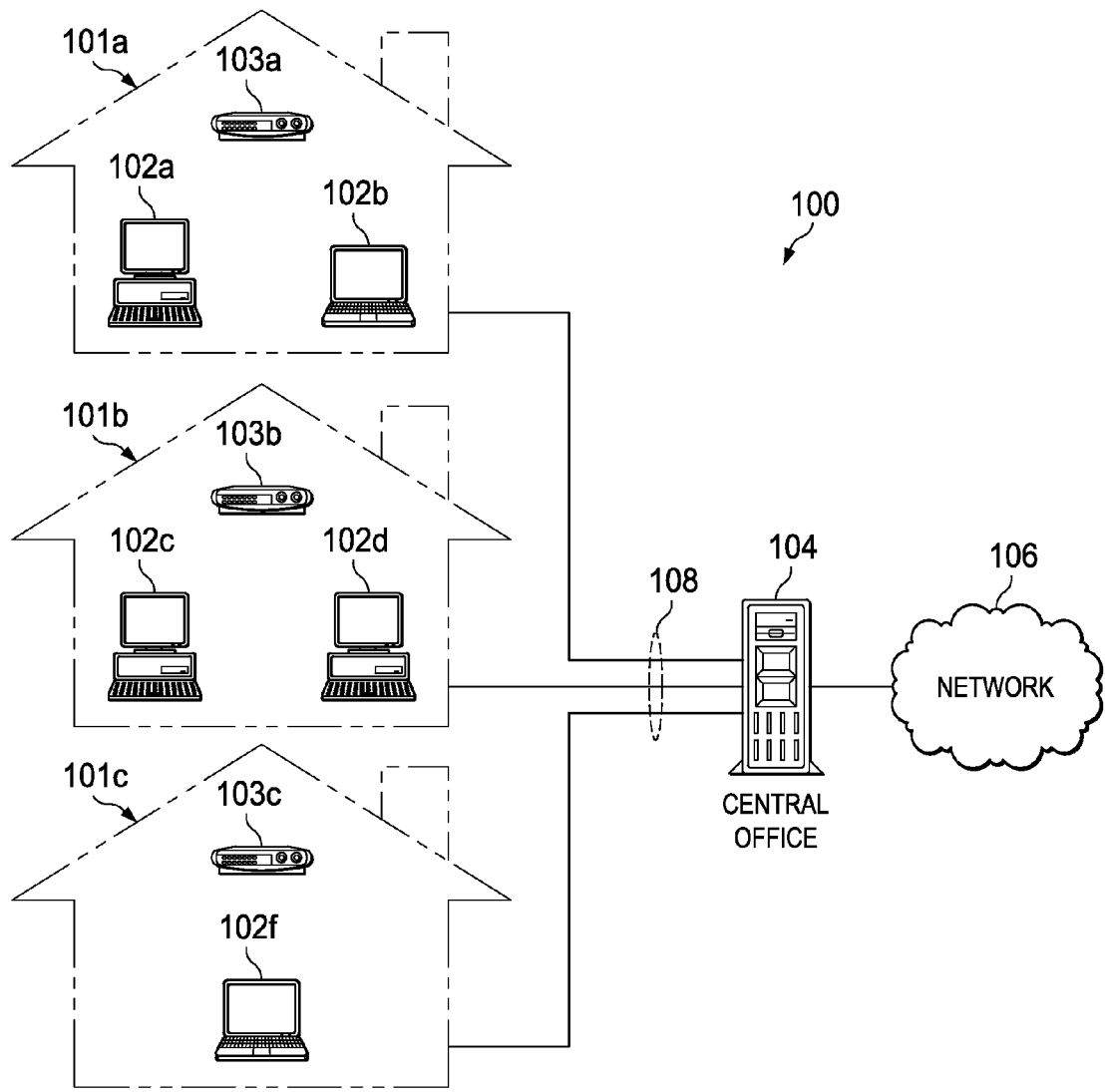
FIG. 1 is a block diagram of an example embodiment of an xDSL system in which embodiments for protecting DSL systems against impulse noise are applied.

Reference is now made to FIG. 1, which illustrates xDSL system 100 in which embodiments for protecting xDSL systems against impulse noise are applied. In the non-limiting example shown in FIG. 1, N end users (or N sets of xDSL CPE 103*a*, 103*b*, 103*c*) are depicted where each user 101*a*, 101*b*, 101*c* is referenced by index m. The end users 101*a*, 101*b*, 101*c* are connected via a loop 108 to a CO 104. The CO 104 may include an xDSL access multiplexer (DSLAM), xDSL line cards, and other equipment for interfacing with end users 101*a*, 101*b*, 101*c*.

In accordance with some embodiments, a protection module 380 (shown in FIG. 3) for protecting DSL systems against impulse noise may be incorporated into the end users' xDSL customer premises equipment (CPE) 103*a*, 103*b*, 103*c*. While embodiments for protecting xDSL systems against impulse noise are described here in the context of CPE 103*a*, 103*b*, 103*c*, the principles discussed herein may also be incorporated into the CO 104 as well.

Figure 3:
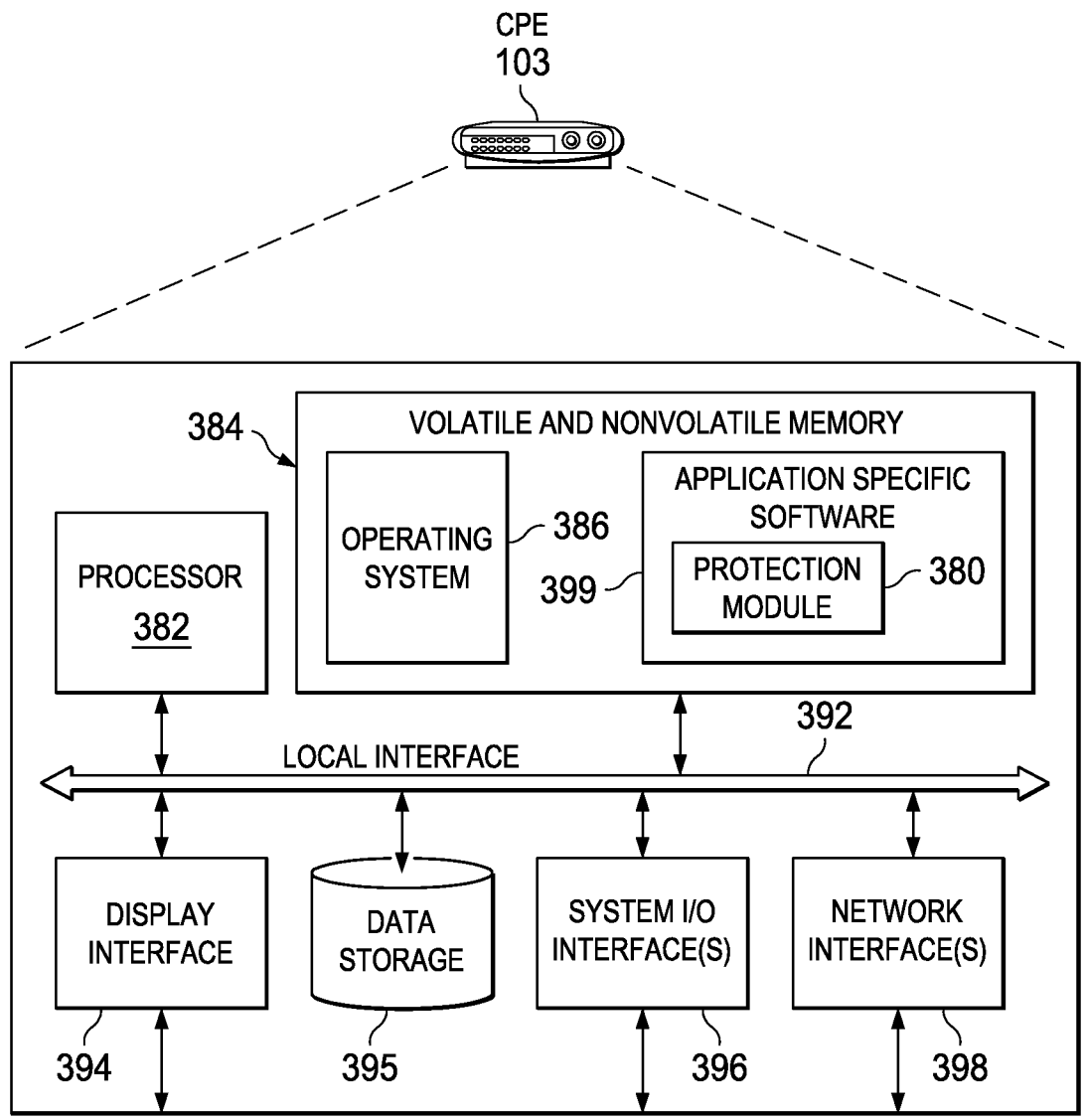
FIG. 3 is a block diagram of an example embodiment of a customer premises equipment in the xDSL system of FIG. 1.

Protection module 380 from FIG. 3 may comprise an impulse noise detector, an analysis block, and a protection block. The impulse noise detector may detect the presence of impulse noise, and the analysis block may monitor and characterize any detected impulse noise on the line. The protection block may provide a mechanism for avoiding bit errors during the occurrence of impulse noise.

In accordance with exemplary embodiments, the analysis block of the impulse noise module may further comprise a time domain analysis module, a frequency domain analysis module, and an intelligence module for performing joint time-frequency domain analyses.

The time domain analysis module may perform analyses in order to determine: 1) whether multiple REIN sources exist on a particular line between the customer premises equipment (CPE) and the central office (CO); 2) whether one or more SHINE sources exist on a particular line between the CPE and CO; 3) an estimation of the lowest inter-arrival time and the highest impulse length; and 4) an estimation of the REIN source and/or SHINE source for instances where only a single source of impulse noise exists on the line. By quickly providing these measurements, the dynamic nature of the system can be better tracked and impulse noise events addressed. Accordingly, such information relating to the impulse noise can be used in real time to provide an effective way for adjusting impulse noise protection.

The analysis module may also perform analyses to determine the nature of REIN or SHINE noise. In particular, the analysis module may perform smart processing by using multi-observation windows to target different ranges of REIN or SHINE sources. Further, sub-band analyses may be utilized to perform a consistency check of all potential REIN sources or SHINE sources. Information derived from the analysis module may then be jointly processed by the intelligence module to provide a final determination of the number of REIN and/or SHINE sources and the corresponding frequencies of these identified REIN and/or SHINE sources.

Figure 2:
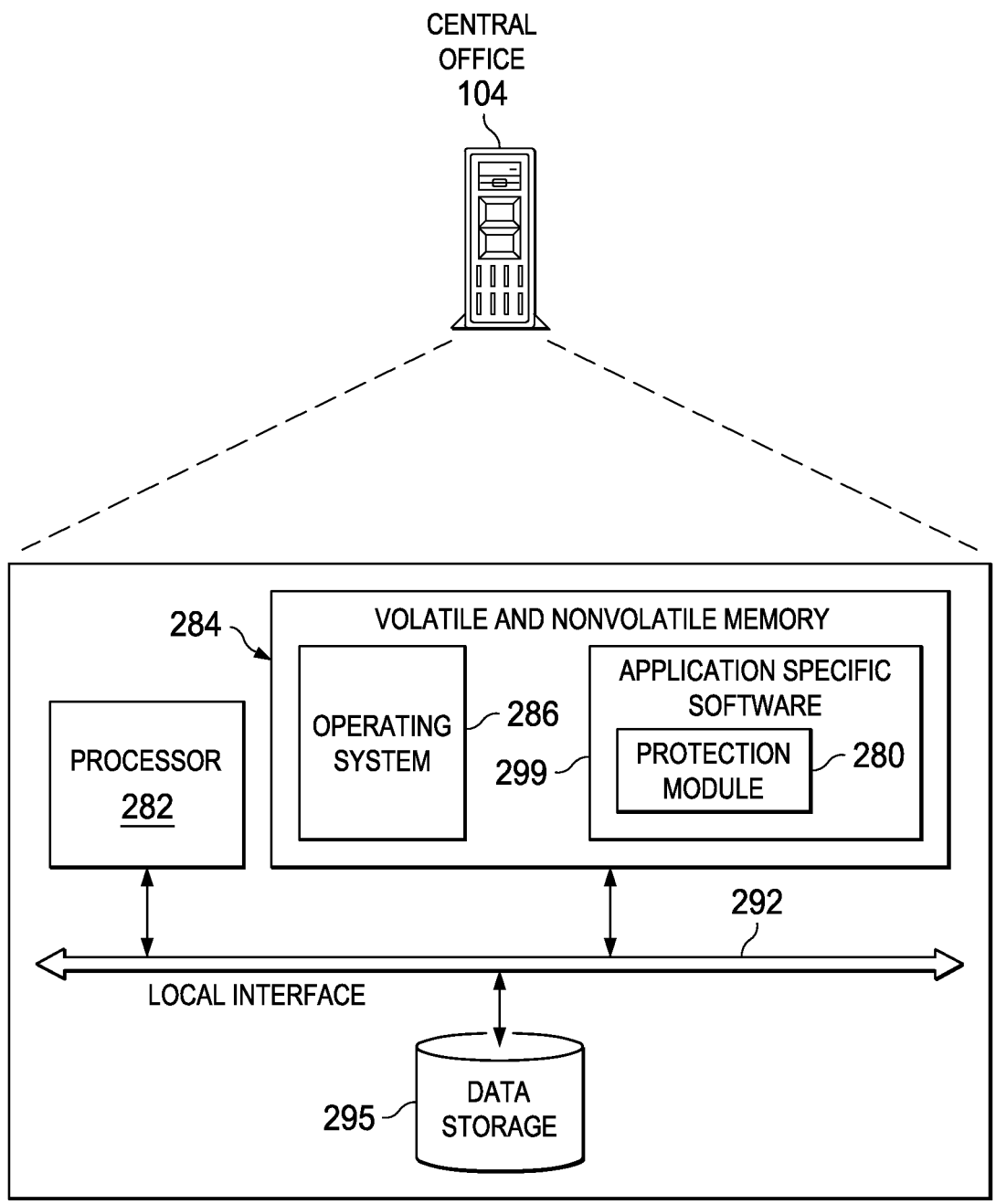
FIG. 2 is a block diagram of an example embodiment of a central office in the xDSL system of FIG. 1.

Reference is now made to FIG. 2, which is a block diagram of an embodiment of CO 104 depicted in FIG. 1. In accordance with certain embodiments, the steps for protecting xDSL systems against impulse noise described in this disclosure may be incorporated in software within a CO. One of ordinary skill in the art will appreciate that COs comprise other components, which have been omitted for purposes of brevity. Generally, the CO 104 may include a processor 282, a memory component 284 (which may include volatile and/or nonvolatile memory components), and a data storage component 295 that are communicatively coupled via a local interface 292.

The local interface 292 may have additional elements, which are omitted for simplicity, such as controllers, buffers (caches), drivers, repeaters, and receivers to enable communications. Further, the local interface may include address, control, and/or data connections to enable appropriate communications among the aforementioned components. The processor 282 may be a device for executing software, particularly software stored in the memory component 284. The processor 282 can be any custom made or commercially available processor, a central processing unit (CPU), an auxiliary processor among several processors associated with CO 104, a semiconductor based microprocessor (in the form of a microchip or chip set), a macroprocessor, an FPGA, an ASIC, or generally any device for executing software instructions.

The memory component 284 can include any one or combination of volatile memory elements (e.g., random access memory (RAM, such as DRAM, SRAM, SDRAM, etc.)) and/or nonvolatile memory elements (e.g., ROM, hard drive, tape, CDROM, etc.). Moreover, the memory component 284 may incorporate electronic, magnetic, optical, and/or other types of storage media. One should note that some embodiments of the memory component 284 can have a distributed architecture (where various components are situated remotely from one another), but can be accessed by the processor 282.

The software in memory component 284 may include one or more separate programs, each of which includes an ordered listing of executable instructions for implementing logical functions. In the example shown in FIG. 2, the software in the memory component 284 may include an operating system 286. Furthermore, the software residing in memory 284 may include application specific software 299, which may further comprise protection module 280. It should be noted, however, that these modules can be implemented in software, hardware or a combination of software and hardware. The operating system 286 may be configured to control the execution of other computer programs and provides scheduling, input-output control, file and data management, memory management, and communication control and related services.

Protection module 280 may comprise an impulse noise detector, an analysis block, and a protection block. The impulse noise detector may detect the presence of impulse noise, and the analysis block may monitor and characterize any detected impulse noise on the line. The protection block may provide a mechanism for avoiding bit errors during the occurrence of impulse noise.

A system component and/or module embodied as software may also be constructed as a source program, executable program (object code), script, or any other entity comprising a set of instructions to be performed. When constructed as a source program, the program is translated via a compiler, assembler, interpreter, or the like, which may or may not be included within the memory component 284, so as to operate properly in connection with the operating system 286. When CO 104 is in operation, the processor 282 may be configured to execute software stored within the memory component 284, communicate data to and from the memory component 284, and generally control operations of the CO 104 pursuant to the software. Software in memory may be read by the processor 282, buffered within the processor 282, and then executed.

FIG. 3 depicts an exemplary embodiment of CPE 103, which may be configured for facilitating communication in the network configuration 100 from FIG. 1. As illustrated in FIG. 3, in terms of hardware architecture, the CPE 103 may include a processor 382, a memory component 384, a display interface 394, a data storage component 395, and one or more input and/or output (I/O) device interface(s) 396 that are communicatively coupled via a local interface 392. The local interface 392 can include, for example but not limited to, one or more buses and/or other wired or wireless connections. The local interface 392 may have additional elements, which are omitted for simplicity, such as controllers, buffers (caches), drivers, repeaters, and receivers to enable communications. Further, the local interface 392 may include address, control, and/or data connections to enable appropriate communications among the aforementioned components. The processor 382 may be a hardware device for executing software, particularly software stored in the memory component 384.

The processor 382 can be any custom made or commercially available processor, a central processing unit (CPU), an auxiliary processor among several processors associated with the CPE 103, a semiconductor based microprocessor (in the form of a microchip or chip set), a macroprocessor, or generally any device for executing instructions.

The memory component 384 can include any one or combination of volatile memory elements (e.g., random access memory (RAM, such as DRAM, SRAM, SDRAM, VRAM, etc.)) and nonvolatile memory elements (e.g., ROM, hard drive, tape, CD-ROM, etc.). Moreover, the memory component 384 may incorporate electronic, magnetic, optical, and/or other types of storage media. One should note that the memory component 384 can also have a distributed architecture, where various components are situated remotely from one another, but can be accessed by the processor 382.

The software in the memory component 384 may include one or more separate programs, each of which includes an ordered listing of executable instructions for implementing logical functions. In the example of FIG. 3, the software in the memory component 384 may include operating system 386, as well as application specific software 399, which may further comprise protection module 380. Other components may also be included.

Additionally, while the logic components 386 and 399 are each illustrated in this non-limiting example as a single piece of logic, these components can include one or more separate software, hardware, and/or firmware modules. Similarly, one or more of these logical components can be combined to provide the desired functionality. Additionally, the operating system 386 may be configured to control the execution of other computer programs and may be configured to provide scheduling, input-output control, file and data management, memory management, and communication control and related services.

A system component embodied as software may also be structured as a source program, executable program (object code), script, and/or any other entity that includes a set of instructions to be performed. When constructed as a source program, the program is translated via a compiler, assembler, interpreter, or the like, which may or may not be included within volatile and nonvolatile memory 384, so as to operate properly in connection with operating system 386.

The input/output devices that may be coupled to system I/O interface(s) 396 may include input devices, for example but not limited to, a keyboard, mouse, scanner, microphone, camera, proximity device, receiver, etc. Further, the input/output devices may also include output devices, for example but not limited to, a printer, display, transmitter, etc. The input/output devices may further include devices that communicate both as inputs and outputs, for instance but not limited to, a modulator/demodulator (modem for accessing another device, system, or network), a radio frequency (RF) or other transceiver, a telephonic interface, a bridge, a router, WIFI communications device, WiMAX communications device, bluetooth communications device, etc. Similarly, a network interface 398, which is coupled to local interface 392, can be configured to communicate with a communications network, such as the network 100 from FIG. 1. While this communication may be facilitated via the CPE 103, this is not a requirement.

More specifically, the network interface 398 may be configured for facilitating communication with one or more other devices. The network interface 398 may include any component configured to facilitate a connection with another device. While in some embodiments, among others, the CPE 103 can include the network interface 398 that includes a Personal Computer Memory Card International Association (PCMCIA) card (also abbreviated as "PC card") for receiving a wireless network card, this is a non-limiting example. Other configurations can include the communications hardware within the client device 102, such that a wireless network card is unnecessary for communicating wirelessly. Similarly, some embodiments may include the network interface 398 for communicating via a wired connection. Such interfaces may be configured with universal serial bus (USB) interfaces, serial ports, and/or other interfaces. In operation, the wireless network interfaces 398 may be configured to communicate with other CPEs 102, 103, and other wireless devices via a wireless local area network (WLAN) or other wireless network.

If the CPE 103 includes a personal computer, workstation, or the like, the software in the memory component 384 may further include a basic input output system (BIOS) (omitted for simplicity). The BIOS is a set of software routines that initialize and test hardware at startup, start the operating system 386, and support the transfer of data among the hardware devices. The BIOS is stored in ROM so that the BIOS can be executed when the CPE 103 is activated.

When the CPE 103 is in operation, the processor 382 can be configured to execute software stored within the memory component 384, to communicate data with the memory component 384, and to generally control operations of the CPE 103 pursuant to the software. Software in memory 384, in whole or in part, may be read by the processor 382, perhaps buffered within the processor 382, and then executed. Additionally, one should note that while the above description is directed to the CPE 103, other devices can also include the components described in FIG. 3.

One should note that the CPE 103, the computing devices 102, and/or the CO 104 can be configured with one or more of the components and/or logic described above with respect to the CPE 103. Additionally, the CPE 103, the computing devices 102, the CO 103, and/or other components of FIG. 1 can include other components and/or logic for facilitating the operations described herein.

Figure 4:
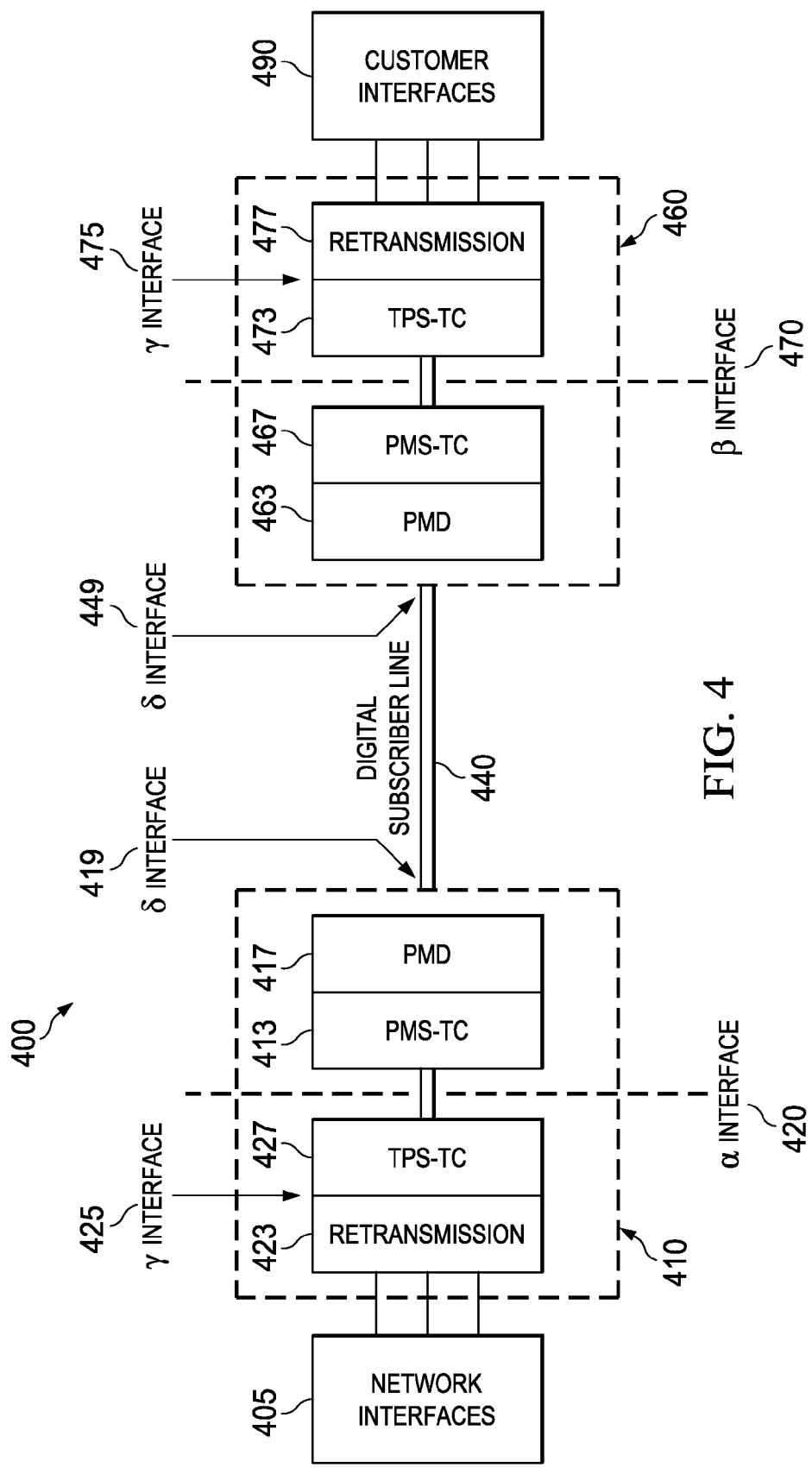
FIG. 4 is a block diagram of an example embodiment of a DSL reference model used in the xDSL system of FIG. 1.

DSL reference model 400 provided in FIG. 4 provides a first transceiver unit 410 and a second transceiver unit 460. For each transceiver unit 410, companion unit 460 terminates an opposing end of digital subscriber line 440. DSL reference model 400 shows the layers of processing in each transceiver unit 410, 460. First transceiver unit 410 provides connection between DSL 440 and network interfaces 405. Second transceiver unit 460 provides connection between DSL 440 and customer interfaces 490. Alpha interface 420, beta interface 470, and gamma ($\gamma$) interfaces 425, 475 convert signals from network interfaces 405 or customer interfaces 490 into a form suitable for transmission on DSL 440. The processing layers may be classified from highest to lowest layer as follows: network/customer interfaces 405, 495; transmission protocol specific-transmission convergence layers (TPS-TC) 427, 473; physical medium specific-transmission convergence layers (PMS-TC) 413, 467; and physical medium dependent layers (PMD) 417, 463.

PMD layers 417, 463 are the lowest layer-processing blocks in transceiver units 410, 460. Therefore, PMD layers 417, 463 are the layers least dependent on a supporting application, and fully dependent on the transport medium (for example, twisted-pair of a subscriber line). PMD layers 417, 463 are the 'core modems' of respective transceiver units 410, 460 in that they provide the modulation and demodulation operations at the bit level. PMD layers 417, 463 may include the following functions: modulation and demodulation; bit clock and symbol clock generation and recovery; trellis coding and decoding; echo-cancellation; channel equalization; and initialization and training. PMD layers 417, 463 process the bit streams as though they are a random bit sequence in that PMD layers 417, 463 do not use knowledge of the meaning or relation of any of the bits that are transmitted. Any bit errors in PMD layers 417, 463 are passed on to the higher layers.

PMS-TC layers 413, 467 are one layer above PMD layers 417, 463. PMS-TC layers 413, 467 may contain the framing and frame synchronization functions, and forward error correction coding modules such as Reed-Solomon coder/decoder and interleaver/deinterleaver. PMS-TC layers 413, 467 use the relation of the payload bits to each other for proper identification in the frame. The framing at this level primarily separates the payload bits from the overhead bits. The overhead channel in PMS-TC layers 413, 467 provide the following functions: frame boundary identification; performance monitoring using, for example, a cyclic redundancy check (CRC); function indicator bits; an embedded operations channel; and optional bit stuffing for support of synchronous timing or rate adaptation functions. PMD layers 417, 463 and PMS-TC layers 413, 467 together provide the capability of transmitting and recovering a payload bit stream and supporting the required operations and maintenance functions via processing of the overhead channel. These blocks together can support the widest range of applications and, hence, they are seen to be "application invariant" in the system reference model.

TPS-TC layers 427, 473 are more application (i.e., protocol layer) specific in that they provide sub-channel separation and identification needed in support of the DSL based service offering. TPS-TC layers 427, 473 work with interface blocks 423, 477 for transport of the different payload channels. TPS-TC layers 427, 473, for example, provide framing of sub-channels (or bearers) in the payload bit sequence that connects to PMS-TC layers 413, 467. The TPS-TC also converts the information content from layer 2 into a bit rate for communication to the PMS-TC. Correspondingly, interfaces layers 423, 477 provide the physical interfaces to support the sub-channels.

The connections between TPS-TC layers 427 and corresponding PMS-TC layers 413 in CO 410 is referred to as $\alpha$-interface 420. This $\alpha$-interface 420 is a logical interface that may define the sub-channel frame structure of the payload bits to be transmitted in PMS-TC layer 413. In CPE 460, the corresponding interface is referred to as $\beta$-interface 470. The connection between interfaces 423, 477 and TPS-TC layers 427, 473 are called the $\gamma$-interfaces 425, 475. The $\gamma$-interfaces 425, 475 may be logical interfaces, and the definition may be dependent on the supported application (i.e., layer 2 protocol such as ATM or Ethernet). The $\delta$-interfaces 419, 449 are the respective interfaces between first transceiver unit 410 and DSL 440 and between second transceiver unit 460 and DSL 440.

Figure 5:
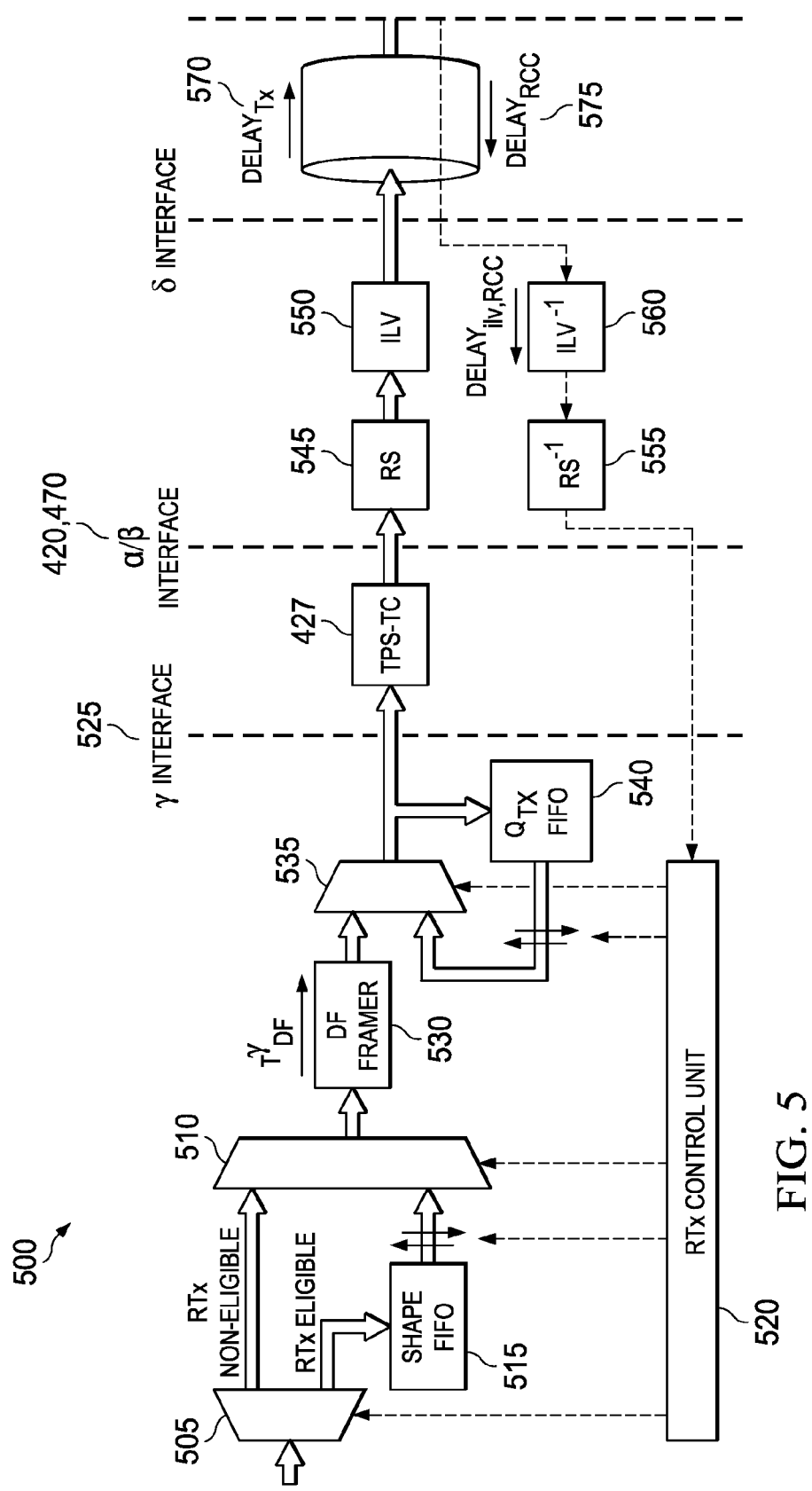
FIG. 5 is a block diagram of an example embodiment of an impulse noise protection system used in the central office of FIG. 2.

According to example embodiments of this disclosure, enhanced protection system 500 of FIG. 5 protects against impulse noise by combining a legacy Interleaved Reed Solomon (RS) code with the retransmission from the $\gamma$-interface (network processor layer) 525 of retransmission control unit 520 of DSL transceiver system 500 using both conventional decoding and erasure decoding. Generally, a retransmission unit comprises blocks 505, 510, 515, 520, 535, 540 above the gamma interface. The various embodiments disclosed may utilize RS coding and interleaving (RS-ILV) to correct error events caused by impulse noise (e.g., one or more REIN, one or more SHINE, combination of REIN(S) and SHINE(s)), and utilize the retransmission above from y-interface 525 for correcting error events not corrected by the RS-ILV scheme.

Impulse noise control may be performed by using the Impulse Noise Protection (INP) parameter (expressed in number of digital multi-tone (DMT) symbols) and interleaving delay parameter of each xDSL. INP is a parameter that measures the number of DMT symbols corrupted by a noise burst that the system may be able to recover. The interleaver delay parameter refers to the delay caused by the combination of transmitter interleaving and receiver de-interleaving in a xDSL connection, measured in seconds. The interleaving generally involves interleaving the content of FEC (forward error correction) codewords. In accordance with various embodiments, the interleaver delay can be dimensioned to be smaller than (or at most equal to) the minimum inter-arrival time ($IA_{min}$) between impulses. The minimum inter-arrival time $IA_{min}$ is the minimum time allowed between two contiguous impulse events of the same impulse noise such that the system can recover corrupted information. Both INP and interleaver delay controls together may allow the parity/packet-length ratio of the RS code to be controlled. The ratio of INP to interleaving delay may be used to measure the amount of errors that need to be corrected in a given time frame. A higher ratio of INP over delay means more parity bytes per codeword in an applied forward error correction (FEC) code. Using the statistics of line performance data, protection system 500 can further stabilize the lines by re-profiling or changing any relevant control parameters.

Disclosed embodiments may involve determining the INP and delay controls such that RS coding and interleaving (RS-ILV) is used to protect against a first noise (typically, but not limited to, a REIN) corrupting up to $INP^{noise1}$ DMT symbols every $IA_{min}^{noise1}$ seconds, and using retransmission above γ-interface 525 for protecting against error events caused by a second noise (typically, but not limited to, a SHINE) corrupting up to $INP^{noise2}$ DMT symbols every $IA_{min}^{noise2}$ seconds that is not corrected by the RS-ILV scheme.

By way of illustration, a REIN as noise1 (noise source 1) and a SHINE as noise2 are utilized. Note, however, that noise1 and noise2 can also be no noise (in which case the disclosed embodiments are disabled), one or more REIN, one or more SHINE, or a combination of one or more REIN and one or more SHINE. One protection scheme that may be used for protecting against SHINE and REIN involves erasure decoding. Erasure decoding is an enhancement to the RS-ILV scheme (and optional in the ADSL and VDSL standards) that improves the INP for a fixed interleaving delay. For some embodiments, both erasure decoding and retransmission above γ-interface techniques may be used jointly. These embodiments introduce an enhanced protection scheme against impulse noise that combines the legacy Interleaved RS code with retransmission above γ-interface 525.

For some embodiments, retransmission may be applied only to the packets that require low error rates and that are not sensitive to latency, such as video (as a non-limiting example). Packets transporting data for latency sensitive applications, such as voice or gaming, for example, may bypass the retransmission operation.

Packets received from the network interfaces 405 may be designated for retransmission eligibility based on their quality of service (QoS) requirements. QoS requirements may include a required bit rate, delay, jitter, and/or packet dropping probability. Quality of service guarantees are important if the network capacity is insufficient, especially for real-time streaming multimedia applications such as voice-over-IP (VoIP), online games, and IPTV (these often require fixed bit rate and are delay sensitive), and in networks where the capacity is a limited resource, such as a non-limiting example of cellular data communication. In the absence of network congestion, QoS mechanisms may not be warranted. For example, video packets require a low error rate but are not as sensitive to latency. These packets may be designated as "retransmit-eligible" for purposes of this disclosure. Packets serving applications that require low latency or that have sensitive delay variation requirements, such as in voice over Internet protocol (VoIP) or gaming applications, may be designated as "non-retransmit-eligible."

In an example embodiment, packets may be flagged as non-retransmit-eligible or retransmit-eligible based on their QoS requirements. For packets flagged as non-retransmit-eligible, the retransmission mechanism may be bypassed. Some overhead bits may be added in the formation of a data fragment (DF). With reference to FIG. 5, the overhead added in the DF may identify the contained packet as being retransmit-eligible or non-retransmit-eligible. For packets flagged as retransmit-eligible, the resulting DFs may be transmitted and the DFs may also be stored in retransmit queue 540. Each DF in retransmit queue 540 should be flagged as retransmit-eligible. The DFs may be multiplexed and forwarded across the γ-layer 525 to TPS-TC layer 427 for transmission within a single bearer. If the system is not capable of separating the packets for flagging as non-retransmit-eligible or retransmit-eligible, then all packets may be fed through retransmit queue 540. In this example embodiment, all packets may be considered to be retransmit-eligible.

At the receive side (such as transceiver unit 600 in FIG. 6), each correctly (i.e., after correct detection) received DF may first be examined for retransmit-eligibility. If the received DF is non-retransmit-eligible, it may be passed on to the higher layers after the overhead is removed. If the received DF is retransmit-eligible, it may be loaded into rescheduling queue 615. The receiver may detect a corrupted packet if the noise condition allows, or if the noise is severe, the receiver may not be able to detect anything except a gap in SID sequence. The receiver requests retransmission of fragments with missing SID, and the transmitter decides on whether or not to retransmit the packet based on retransmit eligibility. The fragmented DFs may then be reassembled into a packet and forwarded to an upper layer.

To optimize efficiency in a retransmission event, the size of the DF should be commensurate with a discrete multi-tone (DMT) symbol period. If the transmit packet size is large for the given data rate, then the packet may span multiple DMT symbols when transmitted. In a non-limiting example, if the packet size is 1500 bytes and the data rate is 10 Mb/s, then the packet will span 4.8 DMT symbols. In this example, the packet may span 5 or 6 DMT symbols. In the event of an impulse noise event affecting one DMT symbol carrying the 1500 byte packet, the entire packet would need to be retransmitted. To improve efficiency, the packet may be fragmented into DF sizes that are commensurate with the DMT symbols. The DF size may be determined based on values of actual network data rate at the output of the TPS-TC layer 427.

If the packet sizes for the given data rate are small relative to the DMT symbol period, then one DMT symbol may actually carry more than one packet. In a non-limiting example, if the data rate is 25 Mb/s and packet size is 200 bytes, then a DMT symbol, on average, could contain 3.9 packets. In this example, if an impulse noise event hits one DMT symbol, only the affected retransmit-eligible packets would be retransmitted. For a non-limiting example with short packets, the DF may be formed to contain more than one short packet.

The overhead bits for each retransmit-eligible data fragment may comprise the following information: 1) flag bits to identify the DF as retransmit-eligible or non-retransmit-eligible; 2) sequence identification bits to identify a sequence of transmitted fragments; 3) checksum bits to check for impulse noise errors in the DF; and 4) bits for "start of packet" and "end of packet" to identify the packet fragment as the beginning of a packet, the end of a packet, the middle of a packet, or a fully contained packet in a single fragment.

As used herein, $INP_{min}$ is the largest INP that is guaranteed for a given Showtime (i.e., data mode) session. In a mixed noise environment, distinct $INP_{min}$ can be set up for each type of noise, i.e., REIN and SHINE, etc. INP parameters for each noise type will be noted $INP_{min}^{rein}$ and $INP_{min}^{shine}$, respectively. As used herein, $INP_{max}$ is the maximum INP that protection system 400 is to provision. In an expected mixed noise environment, distinct $INP_{max}$ may be provisioned by the protection system 400. In an example embodiment, $INP_{max}$ is larger than $INP_{min}$.

As used herein, $Delay_{Tx}$ 570 from FIG. 5 is the delay (expressed in sec) through the alpha/beta interface 420, 470 without taking into account any delay due to forward error correction and interleaving (FEC+ILV) in PMS-TC layer 413, 467. As used herein, $Delay_{RCC}$ 575 from FIG. 5 is the delay of the return control channel without taking into account any delay due to FEC+ILV in PMS-TC layer 413.

As used herein, $Delay_{ilv}$ is the maximum delay of RS deinterleaver 560, computed by $$Delay_{ilv} = \left\lfloor \frac{8 \cdot N \cdot D}{L} \right\rfloor \cdot T_s,$$

where L is the number of bits per DMT symbol, N is the number of bytes per RS codeword, D is the interleaving depth, and $T_s$ is the DMT symbol period (i.e., 250 us). As used herein, Roundtrip is the roundtrip delay, which is defined as the time between the sending a corrupted DF and the reception of a corresponding retransmission request. As used herein, $\text{Roundtrip}_{Tx}$ is a component of the roundtrip delay and corresponds to the propagation delay on the transmitter side, with $$\text{Roundtrip}_{Tx} \triangleq \frac{Delay_{Tx} + Delay_{RCC}}{2}$$

Figure 6:
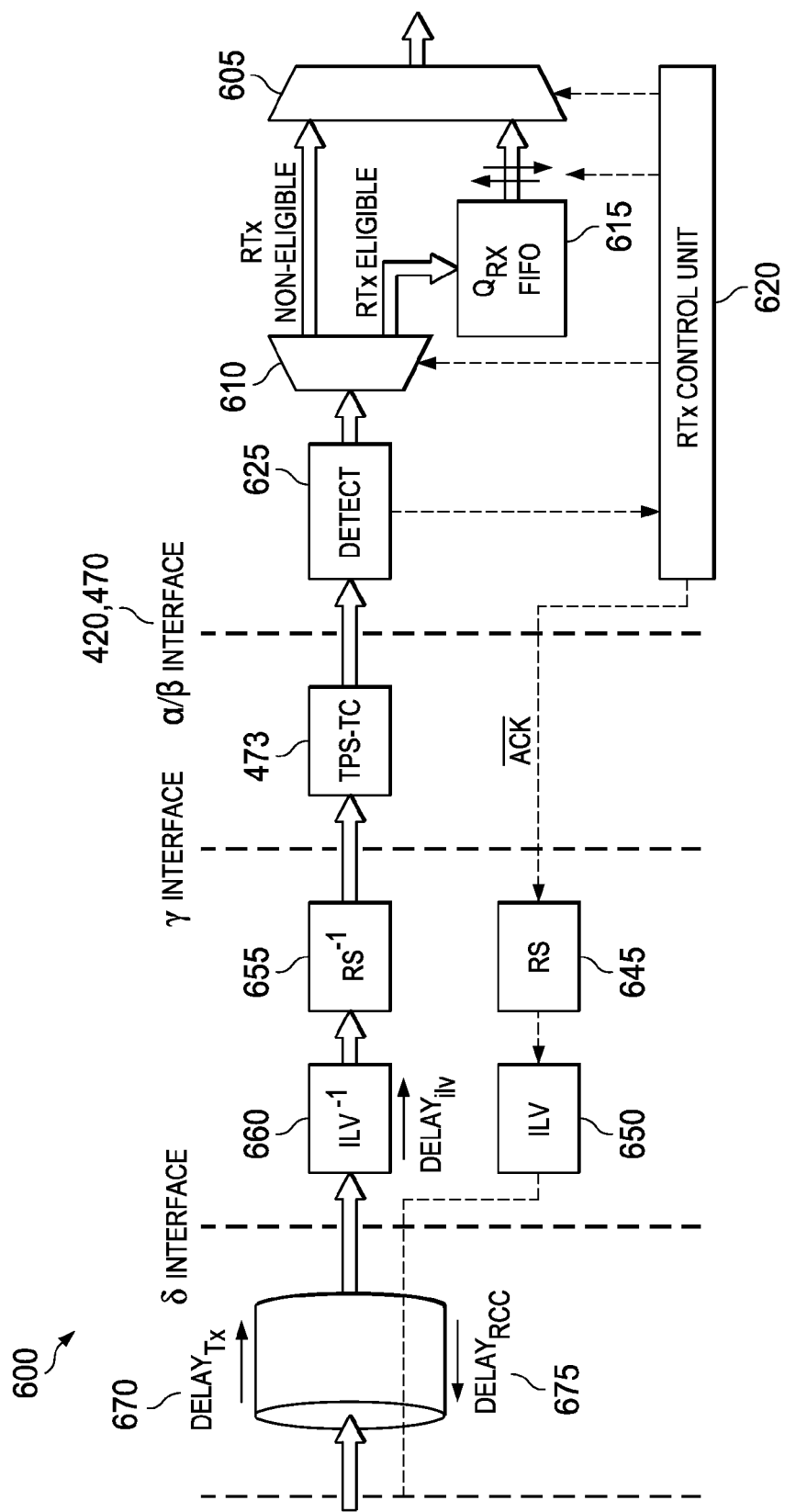
FIG. 6 is a block diagram of an example embodiment of an impulse noise protection system used in the customer premises equipment of FIG. 3.

As used herein, $\text{Roundtrip}_{Rx}$ is the component of the roundtrip delay and corresponds to the propagation delay on the receiver side 600 as provided in FIG. 6. By definition, $$\text{Roundtrip}_{Rx} \triangleq \frac{Delay_{Tx} + Delay_{RCC}}{2}.$$

As used herein, $R_{in,GP}$ is the system net throughput rate for a guaranteed protection $INP_{min}$. This rate comprises the efficiency loss due to 1) retransmitting DFs and 2) the RS code redundancy. As used herein, $R_d$ is the RS encoder input bit rate. As used herein, $R_{d,max}$ is the maximum RS encoder input bit rate under a given transmitter PMS-TC memory constraint.

As used herein, $N_{rtx,max}$ is the maximum number of retransmitted DFs to consider when dimensioning a shaping FIFO. $N_{rtx,max}$ is related to $INP_{max}$. As used herein, $N_{rtx,GP}$ is the number of retransmitted DFs to consider when dimensioning the system for a Guaranteed Protection (GP) $INP_{min}$ (in units of number of DMT symbols). $N_{rtx,GP}$ is related to $INP_{min}$.

Disclosed herein are example embodiments of a retransmission technique located above the TPS-TC layer (e.g., in the network processing layer). Such a retransmission technique can be combined with standard RS coding with (or without) standard erasure-decoding and triangular interleaving at the PMS-TC layer. Example embodiments of the technique involve using the RS code to protect against REIN noise, and using γ-layer retransmission for protecting against error events not corrected by the RS code with erasure decoding, e.g., a SHINE noise in the presence of REIN. Both techniques are used jointly in the case of combined REIN and SHINE noise.

Typical transmissions may comprise different types of services, such as data, voice, and/or video (triple-play). Not all services require an efficient means of protection against impulse noise. Service providers may be interested in protecting the video stream against impulse noise, but may not necessarily be interested in protecting voice and data. Retransmission above the gamma interface allows the knowledge of the content of each packet. Thus, the retransmission scheme can be used to retransmit video packets only, i.e., only a portion of the corrupted data. Packets of interest for retransmission are referred to as "retransmit-eligible" packets herein.

An exemplary system is depicted in FIGS. 5 and 6 and fundamentally comprises retransmission queue 540 and legacy components RS encoder 545, interleaver 550, deinterleaver 560, and RS decoder 555 on the transmission side in this example embodiment. Also, on the receiver side in this example embodiment are corresponding rescheduling queue 615 and legacy components deinterleaver 660 and RS decoder 655. The RS encoder 645 and interleaver 650 are part of the feedback path for requesting retransmission. The transmission side may also comprise shaping queue 515, DF framer 530, multiplexer 505, and demultiplexers 510 and 535. The receive side may also comprise detector 625, multiplexer 610, and demultiplexer 605. Although protection system 600 is shown as the requester of the retransmission, the same blocks may also be included in protection system 500 and 600 such that protection system 500 may also request retransmission of packets from protection system 600.

Elementary RTx packets, called DFs, are made of a tunable number $K_{DF}$ of bytes (typically, $K_{DF}$=64 to 255 bytes (larger is also possible)). Although tunable, $K_{DF}$ may be fixed for a specific show time session, for example. Furthermore, for simplifying the framing, each PTM (e.g., Video) packet may comprise a multiple integer number of DFs. The DF duration may be written $$T_{DF} = \frac{8 \cdot K_{DF}}{L} \cdot \frac{N}{K} \cdot T_s \quad (1)$$

where K is the number of data bytes per RS codeword.

At the transmitter, a retransmission queue can store up to $Q_{Tx}$ DFs.

At the receiver, a rescheduling queue can store up to $Q_{Rx}=M \cdot Q_{Tx}$ DFs, with M>0 and an integer.

The RS code (with interleaving and, optionally, erasure decoding) may protect against REIN noise, and the γ-layer retransmission may protect against error events not corrected by the RS code, e.g. a SHINE noise in the presence of REIN. The γ-layer retransmission (RTx) scheme retransmits only corrupted retransmit-eligible DFs (typically, video DFs). Each corrupted retransmit-eligible DF may, for example, contain 3 bytes overhead for implementing the RTx scheme. Non-retransmit-eligible DFs (typically voice and data DFs) may only need 1 byte overhead.

In an example embodiment of a retransmission process, for all retransmit-eligible DFs that are explicitly detected as corrupted, and only retransmit-eligible DFs that are explicitly detected as corrupted, a retransmission of those corrupted retransmit-eligible DFs is requested (for example, using the NACK protocol). Detection of corrupted DFs may be based on, for example, a CRC check, missing SID or any combination of the two methods. The request may be sent over a low latency path protected against REIN with an interleaved RS code.

In an example embodiment, deinterleaver 660 receives a stream of DFs from δ-interface and deinterleaves the DFs. Then RS decoder 655 uses the RS algorithm to decode the deinterleaved stream of DFs. Detector 625 determines if any of the DFs are corrupted and demultiplexer 610 demultiplexes the DFs into non-retransmit-eligible DFs and retransmit-eligible DFs. The retransmit-eligible DFs are stored in rescheduling queue 615, and retransmit unit 620 sends a request for retransmission of the corrupted retransmit-eligible DFs. The request message is RS encoded and interleaved and transmitted over DSL 440 to protection system 500.

Protection system 500 deinterleaves with deinterleaver 560 and decodes with RS decoder 555. Retransmit unit 520 determines which retransmit-eligible DFs correspond to the request, separates the retransmit-eligible DFs in demultiplexer 505, and shapes them in shaping queue 515. The retransmit-eligible DFs are framed in DF framer 530 and multiplexed with other retransmit-eligible DFs stored in retransmit queue 540. The retransmit-eligible and non-retransmit-eligible DFs are then encoded at RS encoder 545 and interleaved at interleaver 550 before being transmitted on DSL 440.

Figure 7:
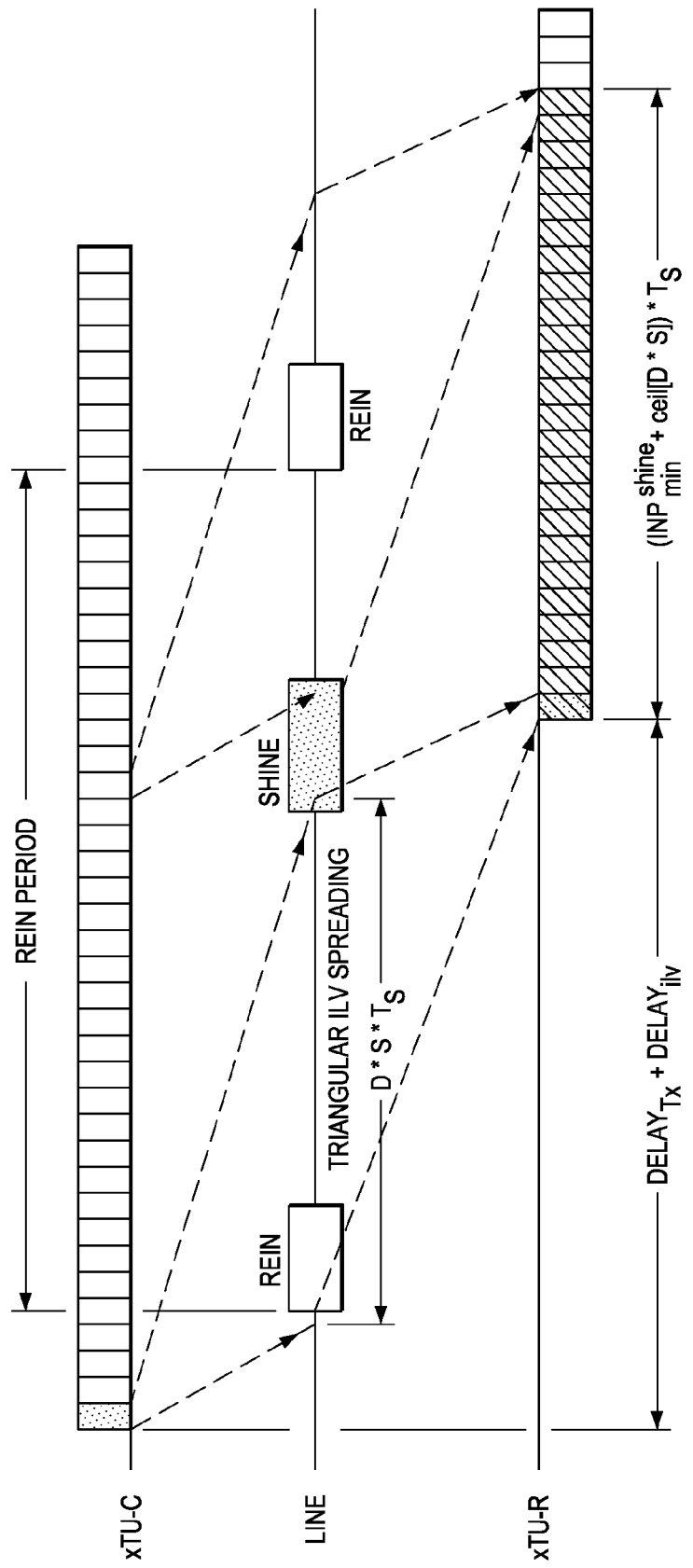
FIG. 7 is a timing diagram of an example embodiment of a spreading of a DF's bytes over the RSIF used in the impulse noise protection system of FIG. 5.

The size of retransmission queue 540 and rescheduling queue 615 may depend on the maximum number of DFs to be retransmitted given a particular impulse noise scenario. The interleaved RS code may be dimensioned to correct the REIN. Yet, when the RS code error correction capability is exceeded (typically when a SHINE impulse occurs on top of REIN), all DFs contained in the RS interleaved frames (RSIF) overlapping the SHINE impulse will be received in error. The spreading of the DF's bytes over the RSIF is depicted in FIG. 7. By choosing the DF size smaller than an RS codeword size (i.e., $K_{DF} \leq K$), the spreading at most equals $D \cdot S$ DMT symbols. Then, given a SHINE impulse overlapping $INP_{min}^{shine}$ DMT symbols, the layer-γ retransmission scheme retransmits up to $$N_{rtx,GPburst} = \left\lceil \frac{(INP_{min}^{shine} + \lceil D \cdot S \rceil) \cdot T_s}{T_{DF}} \right\rceil + 1 \quad (2)$$

DFs.

Equation (2) considers that corrupted retransmit-eligible DFs may be grouped in bursts. Nevertheless, one can well scatter corrupted retransmit-eligible DFs in time by multiplexing (i.e., alternately transmitting) retransmit-eligible and non-retransmit-eligible DFs. Given ρ the ratio of retransmit-eligible DFs over the total number of transmitted DFs, one can fairly assume that only (100·ρ)% of the DFs corrupted by the SHINE will need retransmission. Is such case, the maximum number of retransmitted DFs equals $$N_{rtx,GPmux} = \lceil N_{rtx,GPburst} \cdot \rho \rceil \quad (3)$$

Retransmission queue 540 shall be able to store at least all retransmit-eligible DFs sent within the duration of the roundtrip delay.

When corrupted retransmit-eligible DFs are grouped in bursts, we should consider ρ=1, and hence the number $Q_{Tx}$ of DF in retransmission queue 540 shall be chosen so that $$Q_{Tx} \geq \left\lceil \frac{Roundtrip}{T_{DF}} \right\rceil \quad (4)$$

An expression of the roundtrip delay Roundtrip is given in equation (24) below.

Nonetheless, in most cases, retransmit-eligible and non-retransmit-eligible DFs are multiplexed. In this case, only ρ DFs (where ρ is a ratio that is less than or equal to 1) may be stored in retransmission queue 540. Assuming a well scattered distribution of retransmit-eligible and non-retransmit-eligible DFs, a condition on the size of retransmission queue 540 is given by $$Q_{Tx} \geq \left\lceil \frac{Roundtrip}{T_{DF}} \cdot \rho \right\rceil \quad (5)$$

Rescheduling queue 615 can be dimensioned to $$Q_{Rx} = M \cdot Q_{Tx} \quad (6)$$

Thus, the system is able to do up to M retransmissions of the same DF.

A worst-case throughput rate for a guaranteed protection $INP_{min}$ under memory constraint may be given by $$R_{in,GPburst} = \left(1 - \frac{N_{rtx,GPburst}}{\lceil IA_{min}^{shine} / T_{DF} \rceil}\right) \cdot \min\left(\frac{K}{N} \cdot R_{line}, R_{d,max}\right) \quad (7)$$

where $IA_{min}^{shine}$ is the minimum inter-arrival time.

$$R_{d,max} = \frac{Q_{Tx}}{\left\lceil \frac{Roundtrip}{T_{DF}} \right\rceil} \cdot \frac{K}{N} \cdot R_{line} \quad (8)$$

Note that, given the design constraint in equation (4), the throughput rate may not be limited by $R_{d,max}$.

Similarly, $R_{in,GPmux}$ can be obtained by replacing $N_{rtx,GPburst}$ with $N_{rtx,GPmux}$ and $$\left\lceil \frac{Roundtrip}{T_{DF}} \right\rceil \text{ with } \left\lceil \frac{Roundtrip}{T_{DF}} \cdot \rho \right\rceil$$

in the previous equations, thereby yielding $$R_{in,GPmux} = \left(1 - \frac{N_{rtx,GPmux}}{\lceil IA_{min}^{shine} / T_{DF} \rceil}\right) \cdot \min\left(1, \frac{Q_{Tx}}{\left\lceil \frac{Roundtrip}{T_{DF}} \cdot \rho \right\rceil}\right) \cdot \frac{K}{N} \cdot R_{line} \quad (9)$$

Shaping queue 515 (also called a rate adaptation buffer) may comprise a FIFO memory that compensates the traffic interruptions due to retransmissions. The size of shaping queue 515 may be determined based on the capability of the system to correct a SHINE impulse overlapping up to $INP_{max}^{shine} \geq INP_{min}^{shine}$ DMT symbols. Based on equation (2), the maximum number $N_{rtx,max}$ of DFs to store in shaping queue 515 for a given $INP_{max}^{shine} \geq INP_{min}^{shine}$ is given by $$N_{rtx,max} = \left\lceil \frac{(INP_{max}^{shine} + \lceil D \cdot S \rceil) \cdot T_s}{T_{DF}} \right\rceil + 1 \quad (10)$$

The total (end-to-end) delay is given by $$Delay_{e2e} = \quad (11)$$

$$\underbrace{N_{rtx,max} \cdot T_{DF}}_{Delay_{shape}} + \underbrace{T_{DF} + Delay_{Tx} + \overbrace{\left\lfloor \frac{8 \cdot N \cdot D}{L} \right\rfloor \cdot T_s}^{Delay_{ilv}}}_{Delay_{PHY}} + \underbrace{Q_{Rx} \cdot T_{DF}}_{Delay_{resched}}$$

where $Delay_{shape} = N_{rtx,max} \cdot T_{DF}$ is the jitter delay due to shaping queue 515. $T_{DF}$ in $Delay_{PHY}$ denotes the DF framing delay.

$Delay_{Tx}$ corresponds to the worst-case delay through alpha/beta interface 420, 470 but does not take into account any delay due to FEC+ILV in PMS-TC layer 413, 467.

$$Delay_{ilv} = \left\lfloor \frac{8 \cdot N \cdot D}{L} \right\rfloor \cdot T_s$$

denotes an RS triangular interleaving/deinterleaving delay. $Delay_{resched} = Q_{Rx} \cdot T_{DF}$ denotes the delay due to rescheduling at the receiver.

At the transmitter γ-layer, the modem should be sized to store $N_{rtx,max}$ DFs in shaping queue 515 and $Q_{Tx}$ DFs in the retransmission queue 540. The total γ-layer memory (in bytes) required above the γ-layer (i.e., in the network processor) in CO 410 is then given by $$Mem_{NP,Tx} = (Q_{Tx} + N_{rtx,max}) \cdot K_{DF} \quad (12)$$

Above the receiver's γ-layer, the modem must be able to store $M \cdot Q_{Tx}$ DFs in rescheduling queue 615, yielding a total required memory (in bytes) above the γ-layer required in second transmission unit 460 given by $$Mem_{NP,Rx} = M \cdot Q_{Rx} \cdot K_{DF} \quad (13)$$

At the PMS-TC layer, $(N-1) \cdot (D-1)$ bytes may be stored for triangular interleaving. Those bytes are evenly distributed between first transmission unit 410 and second transmission unit 460, yielding $$Mem_{PHY,Tx} = Mem_{PHY,Rx} = \frac{(N-1) \cdot (D-1)}{2} \text{ bytes} \quad (14)$$

A primary design element in example embodiments of the disclosed γ-layer retransmit scheme in the presence of combined REIN and SHINE is to maximize the overall throughput rate. Such optimization involves balancing the maximum achievable rates above the γ (γ-layer retransmit scheme) and PMS-TC (RS+ILV scheme) layers. Yet, the component γ-layer retransmit scheme and RS code may satisfy some extra constraints in order to enable the target protection.

Regarding RS code design constraints, the component RS code may satisfy the following constraints: a delay constraint, a 1/S constraint, and an interleaving depth constraint (which includes an impulse noise protection constraint, a coding gain constraint and a memory constraint). Regarding the delay constraint, given N, R and $IA_{min}^{rein}$, the RSIF length may not exceed the REIN period. That is, the maximum value of $INP_{min}^{rein}$ shall satisfy $$INP_{min}^{rein} \leq \frac{4000 \cdot R}{N} \cdot IA_{min}^{rein} \quad (15)$$

Regarding the 1/S constraint, $1/S_{max}$ may be fixed, for example, to the standard value 64.

Regarding the interleaving depth constraint, the interleaving depth shall be chosen to satisfy an impulse noise protection (INP) constraint, a coding gain constraint, and a memory constraint. Regarding the protection constraint, the choice of D shall satisfy $$\frac{INP_{min}^{rein} \cdot L}{8 \cdot R} < D \leq 2048 \quad (16)$$

This can be obtained by choosing $$D = \left\lceil \frac{INP_{min}^{rein} \cdot L}{8 \cdot R} \right\rceil \leq 2048 \quad (17)$$

Regarding the coding gain constraint, the choice of D shall be large enough to provision the maximum RS+ILV coding gain. This involves choosing $$D \geq D_{min} = 16 \quad (18)$$

Regarding the memory constraint, the choice of D in equation (17) shall not exceed the available PMS-TC memory. This involves choosing $$D \leq \frac{2 \cdot Mem_{PHY,Tx}}{(N-1)} + 1 \quad (19)$$

If the protection scheme is used in a pure SHINE environment, D may be set to 16 in order to reduce the spreading effect, yet still benefit from the full coding gain of the RS+TCM scheme. D may be set to a value<16, reducing the coding gain, but also reducing latency. In some cases, reducing latency may be more important than maximizing the coding gain (and, hence, the throughput).

As seen in equations (7) and (9), the γ-layer retransmit scheme throughput rate may be limited by the noise protection parameters (which are fixed), the RS code rate, and/or the memory required at the γ-layer. Since availability of memory is not an issue at the γ-layer, memory limitation should not be a factor. Nevertheless, the required memory may be monitored for provisioning the scheme when evaluating performance. Therefore, the γ-layer retransmit scheme throughput rate can be maximized by maximizing the RS code throughput rate $R_d$.

Dimensioning the γ-layer retransmit scheme stems from the choice of M. Although generally equal to 1 in a REIN and SHINE environment with short SHINE impulses, M can become larger when the SHINE impulse seen by the γ-layer retransmit scheme becomes longer than the retransmission queue size. Typically, M is chosen such that $$M \geq \left\lceil \frac{(INP_{min}^{shine} + \lceil D \cdot S \rceil) \cdot T_s}{Q_{Tx} \cdot T_{DF}} \right\rceil \quad (20)$$

Optimizing the overall throughput rate may involve maximizing the achievable rates at both the γ (γ-layer retransmit scheme) and PMS-TC (RS+ILV scheme) layers. Assuming no γ-layer memory limitation, the rates may be maximized by 1) fixing L, R, and the maximum available memory $Mem_{Tx,PHY,max}$ and $Mem_{Rx,PHY,max}$ may be fixed at the PMS-TC layer; 2) computing the RS parameters N and D may be calculated for which a) the rate $R_d$ is maximized and b) all RS code design constraints are met; 3) computing and allocating the γ-layer memory required for achieving the highest rate $R_d$ computed in step 2; and 4) checking that no solution with a lower L gives a higher rate. If such solution exists, then the solution with a lower L may be selected.

Example embodiments of a γ-layer retransmit protection scheme retransmission mechanism may comprise sending requests on an RS coded low latency path protected against REIN. A request protocol may be based on a NACK protocol, in which a request is sent only for DFs that are received corrupted. To reduce the effect of bi-directional impulses, the retransmission request for the same erroneous DF may be repeated $N_{\overline{ACK}}$ times across a lapse of time $N_{\overline{ACK}} \times T_s$ seconds. Each request may contain only the smallest and largest SID of erroneous DFs received within the last $N_{\overline{ACK}} \times T_s$ seconds. Each request may be coded on 4 bytes, for example. All retransmit-eligible DFs with an SID comprised within the range of SIDs requested for retransmission may be retransmitted.

The request may be sent over an upstream low latency path which is protected against bi-directional REIN impulses with an interleaved RS code. Each request may consist of a range of DFs to retransmit, which may be coded in the 4 bytes. Those 4 bytes may then be encoded into 20 bytes with an RS(20,16) code, and then interleaved with a triangular interleaver of depth $D_{RCC}$.

The low latency RS frame may be kept asynchronous with regard to the DMT symbol frame. An example embodiment of its pattern comprises each 20 bytes request sent twice with a time interval of 125 us. Therefore, at least one request will be sent every DMT symbols, without the need to align the RS and DMT frames.

Such an RS+ILV coding scheme allows for protection of the return control channel against REIN, while introducing an extra latency $$Delay_{ilv,RCC} = \frac{20}{16} \cdot INP_{min}^{rein} \cdot T_s \quad (21)$$

The above delay can be achieved by choosing, $$D_{RCC} = \frac{20}{16} \cdot INP_{min}^{rein} \cdot \frac{T_s}{0.125 \times 10^{-3}} \quad (22)$$

Figure 8:
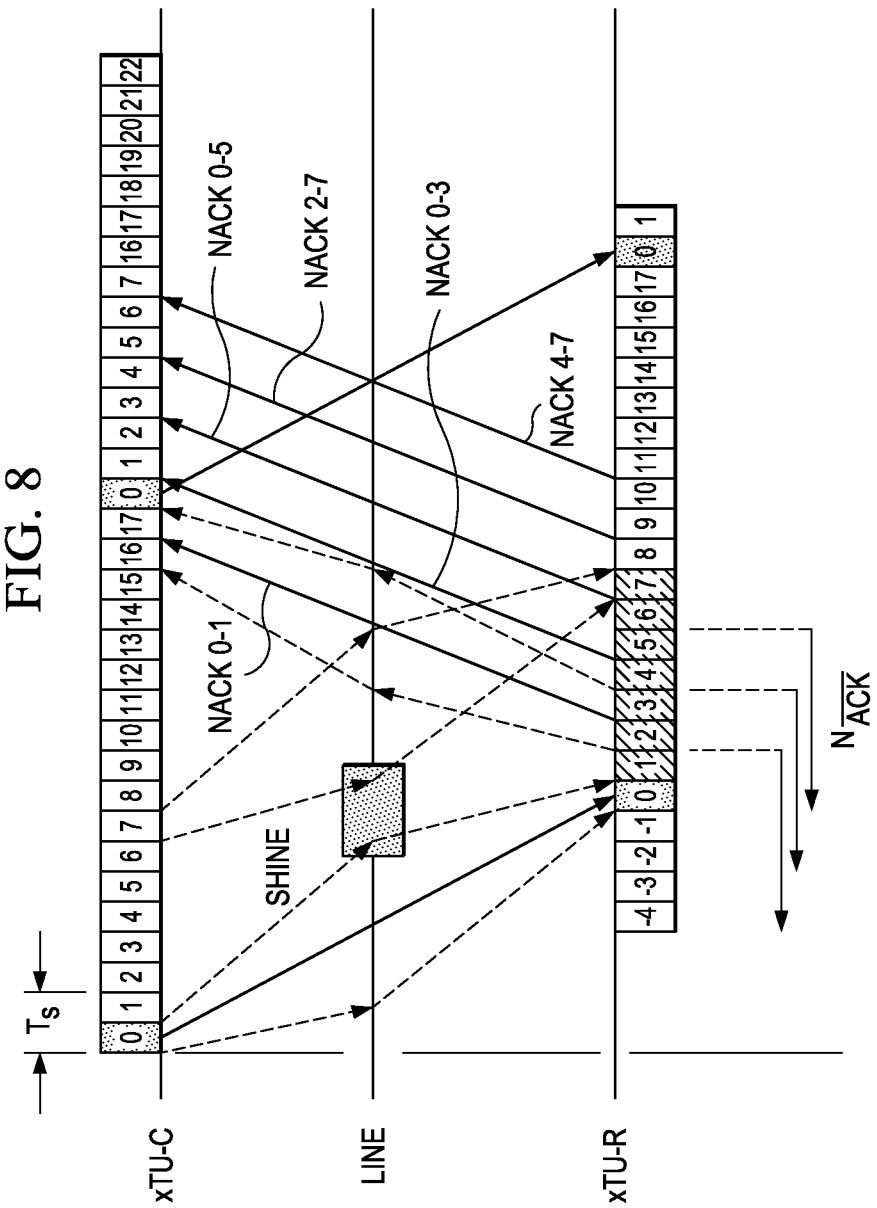
FIG. 8 is a timing diagram of an example embodiment of a request protocol used in the impulse noise protection system of FIG. 5.

The request protocol is illustrated in FIG. 8 for a system with 2 DFs per DMT symbol (i.e., a NACK request is then sent every 2 DFs) and $N_{\overline{ACK}}$=3. In a REIN and SHINE environment, some requests may be corrupted by a SHINE impulse, and hence may not reach the transmitter. Therefore, $N_{\overline{ACK}}$ may be dimensioned large enough to ensure that, eventually, a request for each corrupted DF will successfully reach the transmitter. The value of $N_{\overline{ACK}}$ enabling, in a REIN and SHINE environment, at least one request for each DF to eventually reach the transmitter. This dimensioning is given by $$N_{\overline{ACK}} \geq \left\lceil \frac{\text{Roundtrip} - Delay_{Tx} - Delay_{ilv}}{T_s} \right\rceil \quad (23)$$

where the roundtrip delay Roundtrip is derived below.

Given the request protocol described above, in a REIN and SHINE environment, the maximum delay between the reception of a corrupted DF and the reception of its first (but not necessarily correct) retransmission is given by Roundtrip=Roundtrip$_{Tx}$+Delay$_{ilv}$+Delay$_{ilv,RCC}$+max (Roundtrip$_{Rx}$,INP$_{min}^{shine}$·T$_s$) (24)

Which may be obtained by combining the delays for the 2 following REIN and SHINE scenarios:

In a first example scenario, the SHINE pulse is shorter than Roundtrip$_{Rx}$, and, hence, the first request will reach the transmitter. In such case Roundtrip=Roundtrip$_{Tx}$+Delay$_{ilv}$+Roundtrip$_{Rx}$+Delay$_{ilv,RCC}$ (25)

Figure 9:
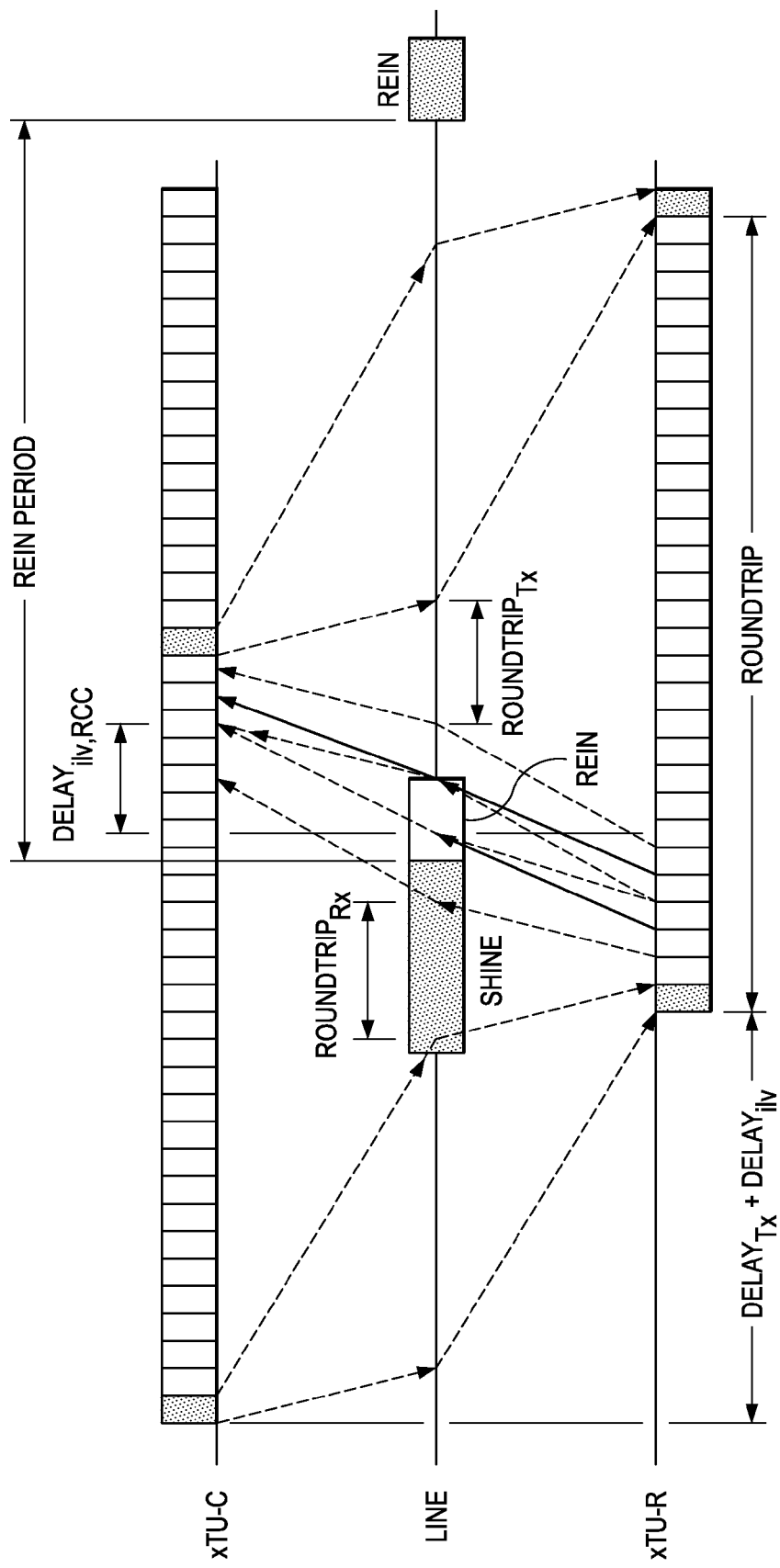
FIG. 9 is a timing diagram of an example embodiment of a request protocol with SHINE corruption used in the impulse noise protection system of FIG. 5.

In a second example scenario, the SHINE pulse is longer than Roundtrip$_{Rx}$, and, hence, may corrupt some requests as depicted in FIG. 9. In such case the roundtrip is limited by the SHINE impulse length, and can be expressed as Roundtrip=Rounldtrip$_{Tx}$+Delay$_{ilv}$+INP$_{shine}^{rein}$·T$s$+Delay$_{ilv,RCC}$ (26)

Figure 10:
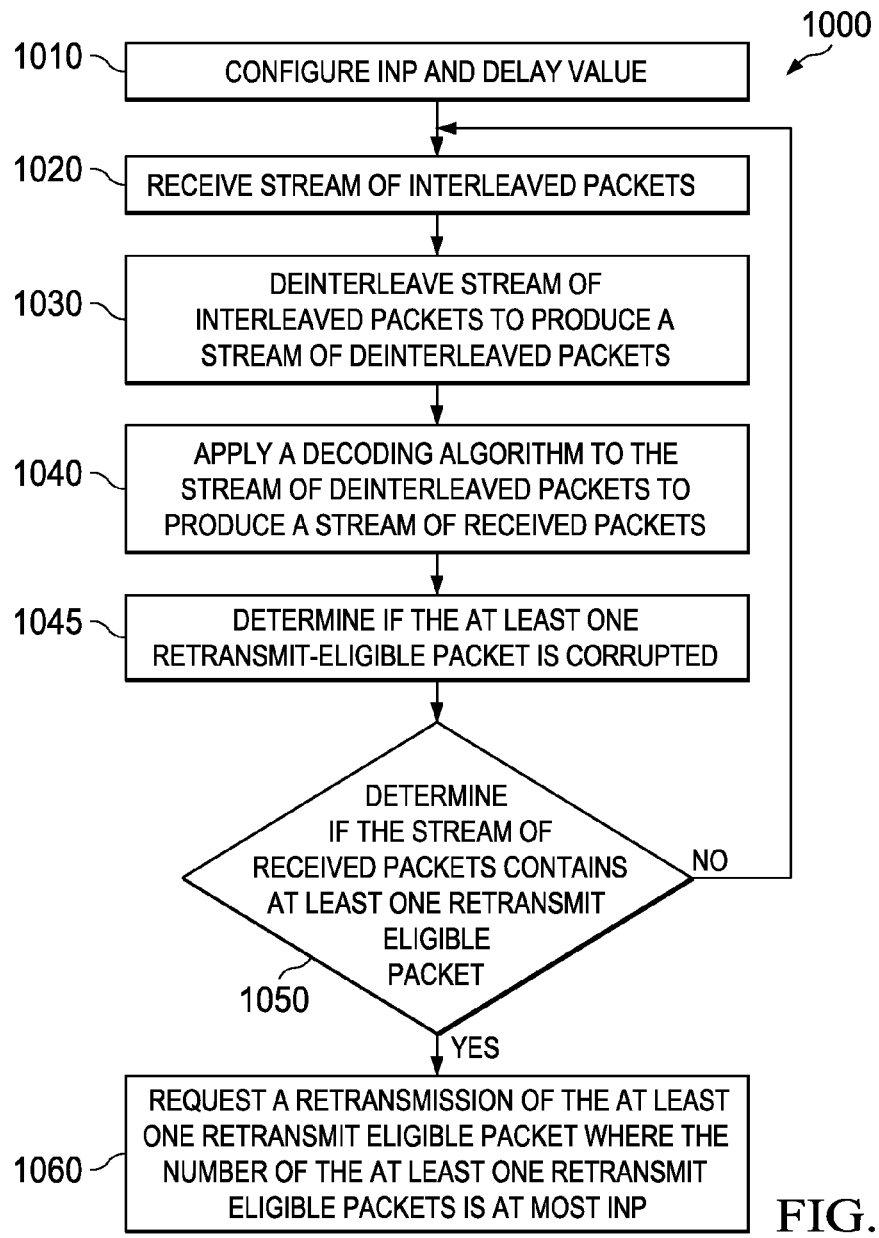
FIG. 10 is a flow chart of an example embodiment of a request for retransmission used in the impulse noise protection system of FIG. 5.

An example embodiment of method for protecting against impulse noise 1000 is provided in the flow chart of FIG. 10. In block 1010, an impulse noise protection (INP) and delay value for each noise (for REIN and/or SHINE) is configured. In block 1020, a stream of interleaved packets is received. In block 1030, the stream of interleaved packets is deinterleaved to produce a stream of deinterleaved packets. In block 1040, a decoding algorithm is applied to the stream of deinterleaved packets to produce a stream of received packets. In block 1045, the received packets are analyzed to determine if any of the packets are corrupted. For some embodiments, this may involve performing a CRC check or checking to see if any sequence identification numbers (SIDs) are missing. In block 1050, the stream of received packets is analyzed to determine if the received stream of packets contains at least one retransmit-eligible packet. In particular, the stream of received packets is analyzed to determine whether the packets belong to retransmit-eligible or non-retransmit-eligible streams. In an ATM network, for example, the virtual channel (VC) may indicate whether a DF belongs to a retransmit-eligible or a non-retransmit-eligible stream. In such a network, corruption is checked only on the retransmit-eligible VC and retransmission is requested. If, however, it is not possible to identify retransmit-eligible or non-retransmit-eligible streams from the lower layer, then a retransmission is requested for all corrupted DFs. In block 1060, a retransmission of the at least one retransmit-eligible packet is requested if the number of the at least one retransmit eligible packets does not exceed the correction capability of the retransmission scheme.

Figure 11:
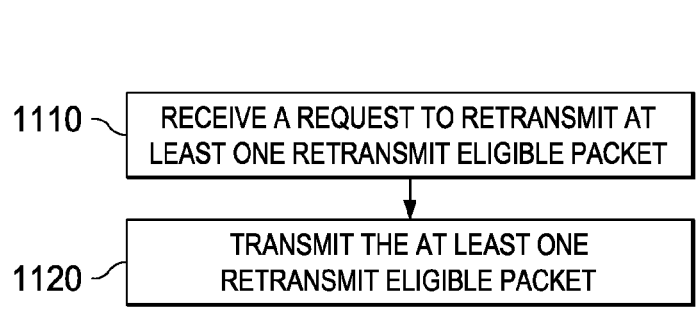
FIG. 11 is a flow chart of an example embodiment of a response to the request for retransmission used in the impulse noise protection system of FIG. 10.

An example embodiment of response 1100 to the request in FIG. 10 is provided in the flow chart of FIG. 11. In block 1110, a request to retransmit at least one retransmit eligible packet is received, assuming the receiver is able to distinguish eligible and non-eligible for retransmission, namely in the ATM case using the VC detection. In block 1120, the at least one packet is retransmitted if it is retransmit eligible. Further, the retransmitted packet is queued ahead of the remaining regular traffic.

In an example embodiment of a transmitter, the transmitter is configured to classify a plurality of packets as retransmit eligible or non-transmit eligible. The transmitter queues packets classified as retransmit eligible in a retransmit queue. Upon receiving a retransmit request from a receiver, the transmitter sends a retransmit response if the received retransmit request is for packets classified as retransmit eligible. Alternatively, the transmitter sends a retransmit denial if the received retransmit request is for packets classified as non-transmit eligible or is for packets not present in the retransmit queue. In accordance with such embodiments, the transmitter is further configured to arrange packets into fragments and append a retransmission header. The transmitter may also be configured to performing erasure decoding to improve RRC message protection on a back channel.

FIG. 4. is an example embodiment of a basic protocol reference model for retransmission above TPS-TC layer 473 as it applies to operation on a single DSL link. A retransmission block resides between the interface layers 405, 490 and TPS-TC layer 473.

An example embodiment of a retransmission function in the transmitter may perform the following operations:
  define the window of retransmission opportunity (transmit retransmission buffer);
  optionally, configuring packets as eligible or not eligible for retransmission (only packets eligible for retransmission are stored in retransmission queue 540);
  packet fragmentation;
  insertion of overhead for the DF for retransmission, e.g., sequence ID (SID), checksum bits, flags, etc.

An example embodiment of a retransmission function in the receiver may perform the following operations:
- retransmission and re-ordering buffer/queue,
- sending of the retransmission requests,
- stripping-off the retransmission overhead in the DF,
- packet reassembly.

In an example embodiment of a retransmission application, packets may be transmitted across y-interface 525. In the transmitter, the retransmission block fragments the packet and adds the fragment overhead to allow fragment reassembly at the receiver. The fragments that are eligible for retransmission are stored in the retransmission queue 540 for a period of time in case retransmission is necessary. Prior to retransmission to the TPS-TC, the transmit retransmission block adds the retransmission overhead to the data fragment to form the DF. TPS-TC 427 in the PHY transmission path may add a CRC at the end of the DF.

In an example embodiment of the receiver, the DF may be fed directly into the input of rescheduling queue 615, or, if it is a retransmitted fragment, it may be inserted in the appropriate location within rescheduling queue 615. In the receiver, rescheduling queue 615 may be alternatively configured as an outlet shaper to smooth out the delay (i.e., no jitter) of a retransmitted DF. The configuration as a rescheduling queue or outlet shaping queue may be defined during initialization. It should be noted, however, that outlet shaping is just one option. The receiver has other options as well. For example, one additional option is to release packets as soon as they are completely reassembled (i.e., rescheduling queue). This introduces jitter, but no additional outlet shaping delay; i.e., if there is a retransmission, then hold the packets to avoid reordering. Yet another option is to release fragments/packets as soon as they are correctly recovered/reassembled (i.e., a pass-thru buffer). This involves not holding packets that arrive after a corrupted packet is being retransmitted and involves not re-ordering packets, but this may be acceptable for applications such as video that receive packets in or out of sequence and the re-ordering is done at the higher layers.

In another example embodiment of the receiver, the receiver may be configured to store received packet data fragments in a shaping buffer. The receiver determines whether the received packet data fragments belong to a protected channel or an unprotected channel based on whether the lower processing layer supports multiple channels. The receiver sends retransmission requests based on whether there are missing sequence identification (SID) numbers and based on whether there are any corrupted packets present. As described earlier, corrupted packets may be identified based on a cyclic redundancy check (CRC). The receiver is further configured to send more than one retransmission request if a response is not received within a predetermined roundtrip time. The receiver generates a timeout request if a response is not received within a predetermined number of retransmission requests being sent.

With regards to the retransmission requests, the receiver may send retransmission requests by either piggy-backing the retransmission requests onto existing outgoing packets or by sending independent requests. As described earlier, the receiver is configured to correct the effects of a first noise source (noise 1) with characteristics $INP^{noise1}$ and $IA_{min}^{noise1}$, where $INP^{noise1}$ is an impulse noise protection value for noise 1, $IA_{min}^{noise1}$ is a minimum inter-arrival time associated with noise 1. The receiver is further configured to correct the effects of a second noise source (noise 2) with characteristics $INP^{noise2}$ and $IA_{min}^{noise2}$, where $INP^{noise2}$ is an impulse noise protection for noise 2, $IA_{min}^{noise2}$ is minimum inter-arrival time associated with noise 2. For such embodiments, noise 1 is a REIN and noise 2 is a SHINE.

At the receiver, there are generally three ways of reassembling data fragments. First, the traffic may be shaped by the receiver by putting all received fragments in the receive queue and releasing them after a constant delay equal to RTT or more (outlet shaper). This mechanism introduces a constant delay, but no jitter is introduced due to retransmission. Second, the receiver can decide to only store the data fragments in the event of retransmission in order to avoid reordering of the packets. During retransmission, the receiver can store all the good packets that are received after corruption. As soon as the receiver receives the retransmitted data fragments, it immediately sends all the queued data fragments. This mechanism (rescheduling queue) introduces jitter but removes the need for introducing the complexity of shaping and is acceptable for applications that can tolerate jitter. Finally, the receiver can decide to send all good data fragments as soon they arrive and not buffer them if there are any corrupted fragments or any missing sequences (pass-thru buffering). Reordering is acceptable to some applications. For example, applications such video decoding and VoIP are capable of receiving out-of-order packets.

Figure 12:
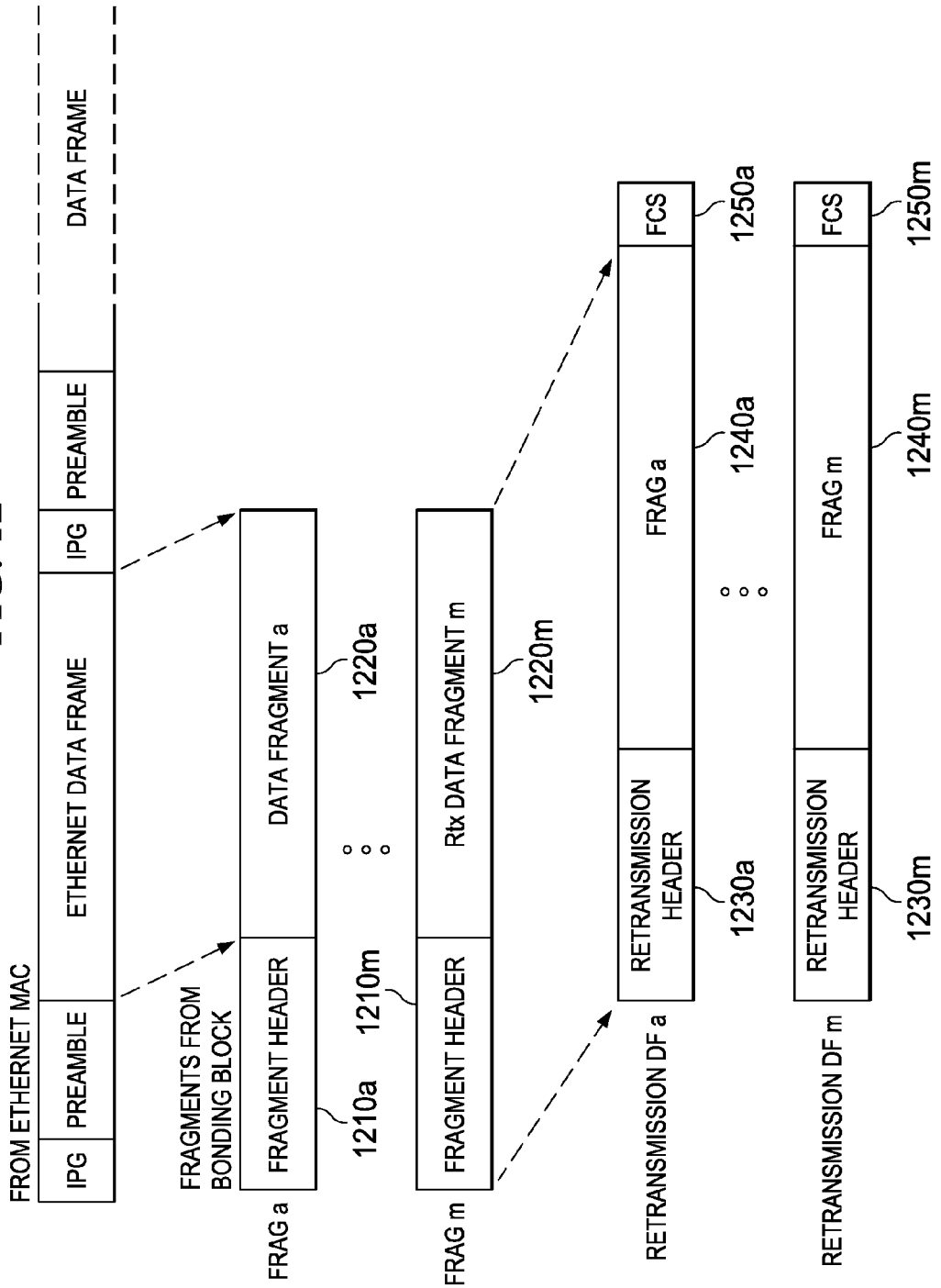
FIG. 12 shows the formulation of the data fragment structure from a given Ethernet packet.
Figure 13:
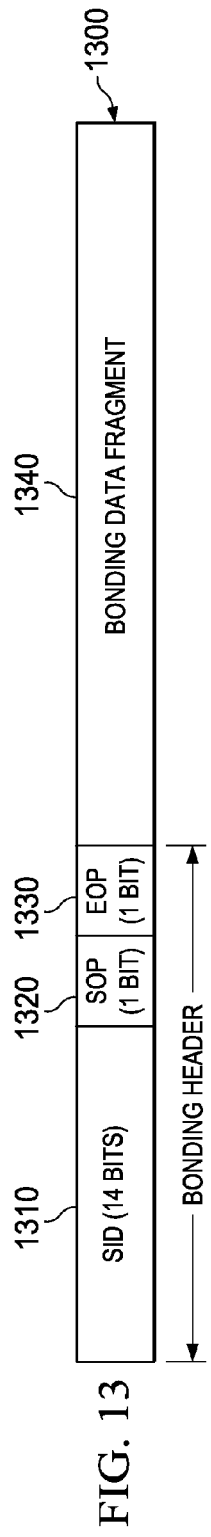
FIG. 13 depicts a fragment data structure.

Incoming packets from interface layer 423 in the transmitter may be fragmented into smaller fragments according to the format in Ethernet Bonding as defined in G.998.2, for example. FIG. 12 shows the formulation of the DF structure from a given Ethernet packet. The packet is divided into m data fragments and fragmentation overhead 1210*a* . . . 1210*m* is added to each data fragment 1220*a* . . . 1220*m* for the purpose of identifying each fragment for the packet reassembly process at the receiver. The fragment data structure is shown in FIG. 13. in which fragment 1300 contains Sequence Identification (SID) field 1310, start of packet (SOP) bit 1320, end of packet (EOP) bit 1330, and data fragment 1340.

Figure 14:
FIG. 14 shows the data fragment structure with expanded retransmission specific header.

The retransmission function adds retransmission specific header 1230*a* . . . 1230*m* to data fragments 1240*a* . . . 1240*m* to formulate a DF for transport with the retransmission protocol. The DF structure with expanded retransmission specific header is shown in FIG. 14.

Retransmission header (RTH) field 1405 is present with each transmitted DF. A retransmission header extension (RTHe) field 1410 may be inserted between RTH field 1405 and SID field 1415 when a retransmission action is asserted.

The retransmission DFs are forwarded to TPS-TC 427 for subsequent transmission on DSL link 440. At the end of each DF, TPS-TC 427 may add Frame Check Sequence (FCS) 1250, which may be configured for example a 16-bit CRC (2 bytes) or a 32-bit CRC (4 bytes).

In an example embodiment, RTH bits 1405 may be used for retransmission specific information, such as:
- Retransmission Fragment Indication (RFIN);
- Retransmission Request indication (RRIN);
- Retransmission Denial indication (RDIN);
- One bit indicating whether the channel is protected or not (protected means eligible for retransmission and non-protected means not eligible for retransmission);
- One bit indicating whether the fragment is a data packet or NAK packet. In upstream if there is no data traffic an empty NAK packet may be sent; and
- Management channel present.

The size of the Sequence ID in the example embodiments described earlier is 14 bits (2 bytes/SID). However, the SID is not limited or restricted to this value.

A unique SID sequence may be applied to the 'protected' packets and a separate unique SID sequence may be applied to the 'non-protected' packets. The protected packets may be considered to be 'eligible for retransmission' and the unprotected packets may be considered to be 'not-eligible for retransmission.' The sequence number present in an example embodiment of an SID field may be identified by the Eligible Fragment for Retransmission (EFRT) identifier bit defined in the retransmission header as given in Table 1.

TABLE 1

Retransmission Header (RTH)

| Bit # | Definition | Description |
|---|---|---|
| 0 | Retransmitted Fragment Indication (RFIN) | ZERO indicates that the data fragment is a 'new' fragment<br>ONE indicates that the data fragment is a 'retransmitted' fragment |
| 1-2 | Retransmission Request Indication (RRIN) | Bits 1 and 2 are coded as [a b] respectively, such that<br>[0 0] = No Retransmission Request<br>[0 1] = Retransmit Request of an Open Range of Fragments<br>[1 0] = Retransmit Request of one contiguous Fragment Range<br>[1 1] = Retransmit Request of multiple Contiguous Fragment Groups |
| 3-4 | Retransmission Denial (RDIN) | Bits 3 and 4 are coded as [a b] respectively, such that<br>[0 0] = No Retransmission Denial<br>[0 1] = Retransmit Denial of an open range of Fragments<br>[1 0] = Retransmit Denial of one contiguous Fragment Range<br>[1 1] = Retransmit Denial of multiple Contiguous Fragment Groups |
| 5 | Eligible Fragment for Retransmission (EFRT) | ONE indicates that the transmitted fragment is eligible for retransmission.<br>ZERO indicates that the fragment is not eligible for retransmission. |
| 6 | NACK Data Packet | ONE indicates that the content of the data fragment contains idle data for transmission of a NACK command. ZERO indicates that the data fragment contains actual data. |
| 7 | Management Channel Present | ONE indicates that the data fragment contains management data; ZERO indicates that the data fragment contains user data. |
| 8-15 | Reserved | |

Extended retransmission header (RTHe) field 1410 may be present when the RRIN, and/or RDIN indicators are active. FIG. 14 shows an example embodiment of retransmission header extension (RTHe) field 1410. In this example embodiment RTHe field 1410 is divided into three sub-fields:

RREQ sub-field 1440, which may contain the SID(S) associated with a retransmission request;

RDEN sub-field 1430, which may contain the SID(s) for the retransmission denials; and the time stamp field 1420, which may carry a time stamp associated with the retransmitted fragment. The time stamp may be used when the link is part of a bonding group. This capability may be negotiated at initialization.

RTHe field 1410 may be present in one or more of the following cases:

the fragment is a retransmitted fragment (RFIN) is not ZERO);

and/or a retransmission request is active, (RREQ 1440 is not [0 0]);

and/or a retransmission denial is/are active (RDEN 1430 is not [0 0]).

If a retransmitted fragment is active (RFIN), RTHe field 1410 may contain the RSID sub-field 1415; If a retransmission request is active (RRIN), RTHe field 1410 may contain RREQ sub-field 1440; similarly, if a retransmission denial is active (RDIN), then RTHe field 1410 may contain the RDEN sub-field 1430. If the retransmission request (RRIN) and/or the retransmission denial (RDIN) are active, then the sub-fields may be contained as shown in FIG. 14.

Time stamp field 1420 may be present with retransmitted packets, occurring when the link is part of a bonding group. Time stamp field 1420 may provide input to the receiver in the removal of jitter on retransmitted fragments and thereby equalize the differential delay relative to each packet. In this regard, the time stamp field 1420 is utilized to help manage the insertion of a retransmitted packet in the outlet shaper buffer so as to preserve the differential delay requirements of the Ethernet bonding protocol.

The size and content of RREQ sub-field 1440 may be determined by the values of bits 1 and 2 (coded as [a b] respectively) in RTH field 1405 per the definition in Table 1. SOP bit 1450 and EOP bit 1460 may not be used for the SIDS communicated in this field. The bits may be reserved for future use. In an example embodiment:

[0 0]=No Retransmission Request. In this case, there is no RREQ sub-field 1440 present in RTHe field 1410.

[0 1]=Open Range Request. In this case RREQ sub-field 1440 may contain the last valid SID before the open range of fragments to be retransmitted. The term open range refers to a condition in which the receiver has not yet received a good fragment (in the detection of the error burst). Instead of waiting for a good fragment to construct a closed range of SID values retransmission, the receiver may request for an open range of SID values. The open range may be specified by the last good fragment SID and no ending fragment SID. Such an open range retransmission request may be overwritten by a subsequent retransmission request with a finite range of SID values.

[1 0]=Retransmit Request of one contiguous Fragment Range. In this case RREQ sub-field 1440 may contain the LastValidSID and FirstValidSID of the contiguous fragment range.

[1 1]=Retransmit Request of multiple Contiguous Fragment Groups. The first byte may define the number of contiguous fragment groups. The remaining bytes list the LastValidSID and FirstValidSID for each fragment group.

The size and content of RDEN sub-field 1430 may be determined by the values of bits 3 and 4 (coded as [a b] respectively) in RTH field 1405 per the definition in Table 1. SOP bit 1450 and EOP bit 1460 may not be used for the SIDS communicated in this field. The bits may be reserved for future use. In an example embodiment:

[0 0]=No Retransmission Denial. In this case, there is no RDEN sub-field 1430 present in RTHe field 1410.

[0 1]=Retransmit Denial of an open Range of Fragment. In this case RDEN sub-field 1430 may contain the last validSID. All fragments that have been transmitted before this SID may be denied for retransmission.

[1 0]=Retransmit Denial of one contiguous Fragment Range. In this case RDEN sub-field 1430 may contain the LastValidSID and FirstValidSID of the contiguous fragment range.

[1 1]=Retransmit Denial of multiple Contiguous Fragment Groups. The first byte defines the number of contiguous fragment groups. The remaining bytes list the LastValidSID and FirstValidSID for each fragment group.

In an example embodiment, a retransmission denial for one or more fragments that have been requested for retransmission by the receiver may be sent by the transmitter when the requested fragment(s) have not been eligible for retransmission or are no longer available in the transmitter. This information may prevent the receiver from indefinitely waiting for a retransmission of these fragments.

In an example embodiment, a default condition may set all fragments to be eligible for retransmission. When packets can be identified by higher layers in the transmitter to belong to a service that does not need to be protected by retransmission then all the resulting fragments may be marked as "not eligible for retransmission" in the retransmission header. Received complete packets that are marked as "not eligible for retransmission" may instantly be forwarded to the next layer by the receiver and need not be stored in the retransmission buffer of the receiver. If it is impossible to assemble any received fragment into a complete packet because at least one related fragment is definitely missing, all of those fragments may be discarded.

The transmitter may use different priorities for packets that are not eligible for retransmission relative to packets that may be retransmitted. The different packet streams may be prioritized as follows:

1. VoIP—Low Latency, fixed rate guaranteed, not eligible for retransmission.
2. Video—Fixed latency guaranteed, fixed rate guaranteed, and eligible for retransmission.
3. Internet Data—Best effort latency and rate, not eligible for retransmission.

The following primitives may be used to define operations for the TPS based retransmission receiver:

TxDtuRetransmitted—This event may occur when a DF is retransmitted at the transmit side of the retransmission function.

RxDtuCorrected—This event may occur when a retransmitted DF is correctly received by the receive retransmission function.

RxReTxDtuUncorrected—This anomaly may occur in the receiver when an expected retransmission eligible DF is not successfully corrected by retransmission. This may result in a dropped packet at reassembly.

RxNonReTxDtuUncorrected—This anomaly may occur in the receiver when a DF non-eligible for retransmission is not correctly received or missing. This may result in a dropped packet at reassembly.

In an example embodiment, anomalies may be counted in the receiver with 32 bit counters, where all counters are wrap-around counters and reset only after power-up. The communication of counter values between CPE 460 and CO 410 may be via a management channel at the y-interface 425, where the counter values may be passed in a dedicated management DF. The DF may be identified as management fragment by setting bit 7 to ONE in RTH field 1510 (see Table 1). The structure of an example embodiment of a management DF is provided in FIG. 15, and parameter fields 1520 may be as defined in Table 2 for transmission from CPE 460 to CO 410 (upstream) and in Table 3 for transmission from CO 410 to CPE 460 (downstream).

TABLE 2

Retransmission Management Parameters from CPE 460 to CO 410.

| Param N | Parameter Name | Number of Bytes |
|---|---|---|
| 1 | Reserved | 4 |
| 2 | RxDtuCorrected | 4 |
| 3 | RxReTxDtuUncorrected | 4 |
| 4 | RxNonReRxDtuUncorrected | 4 |

TABLE 3

Retransmission Management Parameters from CO 410 to CPE 460.

| Param N | Parameter Name | Number of Bytes |
|---|---|---|
| 1 | Reserved | 4 |
| 2 | TxDtuRetransmitted | 4 |

In an example embodiment, if retransmission is not enabled, then the error handling and reporting with ES, SES, UAS, and FECS may be controlled from counting the anomalies in the PMD and PMS-TC. If retransmission is enabled, the anomalies to be counted may also be provided by the retransmission function in the TPS-TC. When retransmission in the TPS-TC is enabled, the CRC violations in the PMS-TC overhead channel may not be used as a sole indication of the transmission quality.

If retransmission is enabled, the errored seconds may be distinguished between traffic that is eligible and non-eligible for retransmission, and may be evaluated as follows:

Retransmission Eligible Errored Seconds (ReES) in an example embodiment may be a count of 1-second intervals with one or more RxReTxDtuUncorrected anomalies, with one or more LOS defects, one or more LPR defects, or if INP_min_rtn<=68 symbols with one or more SEF defects.

Non-Retransmission Eligible Errored Seconds (Non-ReES) in an example embodiment may be a count of 1-second intervals with one or more RxNonReTxDtuUncorrected anomalies, with one or more LOS defects, one or more LPR defects, or if INP_min_rtn<=68 symbols with one or more SEF defects.

If retransmission is enabled in an example embodiment, the severely errored seconds may be distinguished between the traffic that is eligible and non-eligible for retransmission, and may be evaluated as follows:

Retransmission Eligible Severely Errored Seconds (ReSES) in an example embodiment may be a count of 1-second intervals with 18 or more RxReTxDtuUncorrected anomalies, with one or more LOS defects, one or more LPR defects, or if INP_min_rtn<=68 symbols with one or more SEF defects.

Non-Retransmission Eligible Severely Errored Seconds (NonReSES) in an example embodiment may be a count of 1-second intervals with 18 or more RxNonReTxDtuUncorrected anomalies, with one or more LOS defects, one or more LPR defects, or if INP_min_rtn<=68 symbols with one or more SEF defects.

TABLE 4

Retransmission Configuration Parameters

| Parameter | Capability |
| --- | --- |
| Delay_max_rt$_n$ | The maximum end-to-end packet delay, from γ-interface to γ-interface. The TPS-TC stream #n may be transported with underlying PMS-TC functions configured such that the derived parameter delay$_p$ is no larger than this control parameter delay_max$_n$. |
| INP_min_rtp$_n$ | The minimum TPS-TC periodic impulse noise protection. The TPS-TC stream #n may be transported with the retransmission functions configured such that the derived parameter INP$_p$ is not lower than this control parameter INP_min_rtp$_n$ for periodic impulse disturbers. |
| IAT_min_rtp$_n$ | The minimum inter-arrival time of periodic impulses. The TPS-TC stream #n may be transported with the retransmission functions configured such that the derived parameter INP$_p$ is not lower than this control parameter INP_min_rtp$_n$ while the time between the occurrence of subsequent periodic impulse noise disturbers is not shorter than IAT_min_rtp$_n$. |
| INP_min_rt$_n$ | The minimum TPS-TC impulse noise protection. The TPS-TC stream #n may be transported with the retransmission functions configured such that the derived parameter INP$_p$ is not lower than this control parameter NP_min_rt$_n$. |
| IAT_min_rt$_n$ | The minimum inter-arrival time. The TPS-TC stream #n may be transported with the retransmission functions configured such that the derived parameter INP$_p$ is not lower than this control parameter INP_min_rt$_n$ while the time between the occurrence of two subsequent impulse noise disturbers is not shorter than IAT_min_rt$_n$. |
| Net_max_protect$_n$ | The maximum net data rate supported by retransmission for the protected fragments. |
| Net_min_fast$_n$ | The minimum net data rate supported by retransmission for the unprotected fragments. |

An example embodiment of a retransmission configuration and control parameters are defined for retransmission above TPS-TC 427 in Table 4. The retransmission scheme disclosed in example embodiments may be optimized to mitigate spurious, random impulse noise events. Frequent impulse noise of type REIN may be cancelled using the above retransmission scheme or it may be cancelled by means located below the TPS-TC. A well known solution below the TPS-TC is FEC (i.e. Reed-Solomon Coding) with interleaving; for optimum efficiency the use of erasure decoding is recommended.

In an alternative embodiment of transporting retransmission requests, a dedicated bearer may be implemented in a separate latency path. In this scenario, a second latency path may be configured with a shortened RS code to reduce the delay while maintaining or improving the protection against impulse noise.

Only retransmission requests may be sent through this separate latency path to achieve minimal delay. The data rate of the second channel may be configured for an optimal compromise for minimizing the latency and the data rate dedicated for retransmission.

Figure 15:
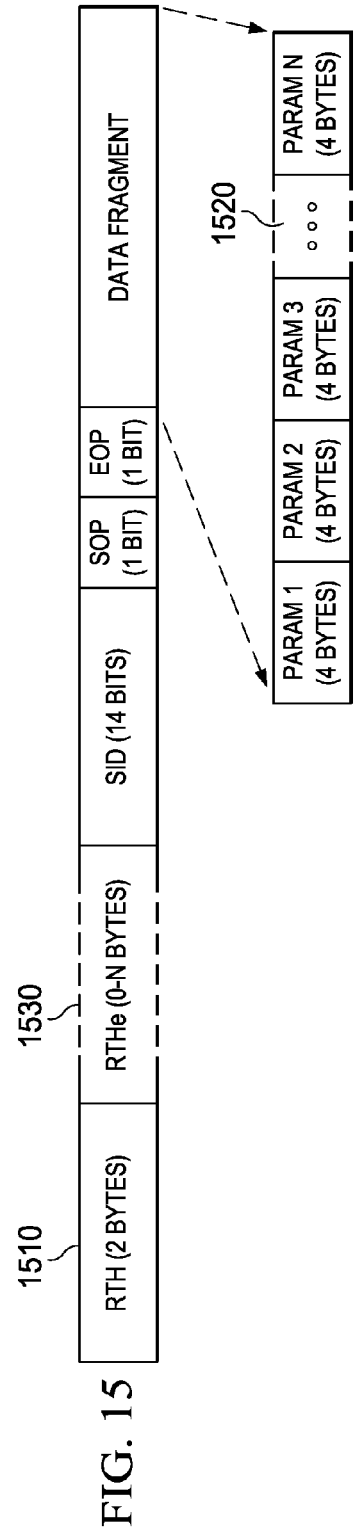
FIG. 15 shows the structure of an example embodiment of a management data fragment.

FIG. 15 provides the format of the retransmission request packet for the separate bearer. RTH field 1510 and RTHe field 1530 may provide the information in the same format as described earlier. For minimal overhead and delay the TPS-TC for the retransmission request channel may support "short packets."

The second latency path may be dedicated for the transmission of retransmission requests. When sending a retransmission request in this second latency path, Bit 6 of RTH field 1510 may be set to 1, and the SID, SOP, EOP, and the fragment data fields may be left as null data.

The example embodiments of the protection scheme disclosed herein have been developed based on both Reed Solomon coding and γ-layer retransmissions such as, queuing, rescheduling and shaping memory sizes, delays, and rates. Example embodiments include the retransmission of packets to protect against the errors that are not corrected by a legacy Reed Solomon coding scheme. Example embodiments also avoid changes at the PMS-TC layer of the existing silicon, since the retransmission is employed above the γ-layer.

The flow chart of FIGS. 10 and 11 show the architecture, functionality, and operation of a possible implementation of the protection software. In this regard, each block represents a module, segment, or portion of code, which comprises one or more executable instructions for implementing the specified logical function(s). It should also be noted that in some alternative implementations, the functions noted in the blocks may occur out of the order noted in FIGS. 10 and 11. For example, two blocks shown in succession in FIG. 10 may in fact be executed substantially concurrently or the blocks may sometimes be executed in the reverse order, depending upon the functionality involved. Any process descriptions or blocks in flow charts should be understood as representing modules, segments, or portions of code which include one or more executable instructions for implementing specific logical functions or steps in the process, and alternate implementations are included within the scope of the example embodiments in which functions may be executed out of order from that shown or discussed, including substantially concurrently or in reverse order, depending on the functionality involved. In addition, the process descriptions or blocks in flow charts should be understood as representing decisions made by a hardware structure such as a state machine.

The logic of the example embodiment(s) can be implemented in hardware, software, firmware, or a combination thereof. In example embodiments, the logic is implemented in software or firmware that is stored in a memory and that is executed by a suitable instruction execution system. If implemented in hardware, as in an alternative embodiment, the logic can be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc. In addition, the scope of the present disclosure includes embodying the functionality of the example embodiments disclosed herein in logic embodied in hardware or software-configured mediums.

Software embodiments, which comprise an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, or communicate the program for use by or in connection with the instruction execution system, apparatus, or device. The computer readable medium can be, for example but not limited to, an electronic, magnetic, optical, electromagnetic, infrared, or semiconductor system, apparatus, or device. More specific examples (a nonexhaustive list) of the computer-readable medium would include the following: a portable computer diskette (magnetic), a random access memory (RAM) (electronic), a read-only memory (ROM) (electronic), an erasable programmable read-only memory (EPROM or Flash memory) (electronic), and a portable compact disc read-only memory (CDROM) (optical). In addition, the scope of the present disclosure includes embodying the functionality of the example embodiments of the present disclosure in logic embodied in hardware or software-configured mediums.

Therefore, at least the following is claimed:

1. A protection apparatus in a central office (CO) or a customer premise equipment (CPE) in an xDSL system for mitigating the effects of repetitive electrical impulse noise (REIN) and a single high impulse noise event (SHINE) within a physical layer and network processing layer, comprising:
 a forward error correction (FEC) module, wherein the FEC module comprises:
 a Reed-Solomon (RS) encoder-decoder; and
 an interleaver-deinterleaver; and
 a retransmission module configured to request retransmission of corrupted data fragments within the data stream not corrected by the FEC module,
 wherein retransmission is performed above a gamma interface of the xDSL system, the gamma interface being an interface above a transmission protocol layer.

2. The protection apparatus of claim 1,
 wherein the FEC module is configured to mitigate the effects of a first noise source (noise 1) with characteristics $INP^{noise1}$ and $IA_{min}^{noise1}$, where $INP^{noise1}$ is an impulse noise protection value for noise 1, $IA_{min}^{noise1}$ is a minimum inter-arrival time associated with noise 1; and
 wherein the retransmission module is configured to mitigate the effects of a second noise source (noise 2) with characteristics $INP^{noise2}$ and $IA_{min}^{noise2}$ where $INP^{noise2}$ is an impulse noise protection value for noise 2, $IA_{min}^{noise2}$ is minimum inter-arrival time associated with noise 2.

3. A method in an xDSL system, the method comprising:
 classifying a plurality of packets as retransmit eligible or non-transmit eligible;
 queuing packets classified as retransmit eligible in a retransmit queue;
 receiving a retransmit request and performing one of:
 sending a retransmit response if the received retransmit request is for packets classified as retransmit eligible; and
 sending a retransmit denial if the received retransmit request is for packets classified as non-transmit eligible or is for packets not present in the retransmit queue,
 wherein retransmission is performed above a gamma interface of the xDSL system, the gamma interface being an interface above a transmission protocol layer.

4. The method of claim 3, further comprising arranging packets into fragments and appending a retransmission header.

5. The method of claim 4, further comprising performing erasure decoding to improve Return Control Channel (RCC) message protection on a back channel.

6. The method of claim 3, wherein eligibility for retransmission is based on the Quality of Service (QoS) requirement.

7. A method in an xDSL system, the method comprising:
 storing received packet data fragments in a receiver queue;
 determining whether the received packet data fragments belong to a protected channel or an unprotected channel based on whether a lower processing layer supports multiple channels;
 sending retransmission requests based on the presence of one or more of the following:
 missing sequence identification (SID) numbers; and
 corrupted packets, wherein corrupted packets are determined based on a cyclic redundancy check (CRC); and
 sending more than one retransmission request if a response is not received within a predetermined roundtrip time,
 wherein retransmission is performed above a gamma interface of the xDSL system, the gamma interface being an interface above a transmission protocol layer.

8. The method of claim 7, further comprising generating a timeout request if a response is not received within a predetermined number of retransmission requests being sent.

9. The method of claim 7, further comprising receiving request denial packets in response to requesting retransmission requests.

10. The method of claim 7, wherein sending retransmission requests is performed by either piggy-backing the retransmission requests onto existing outgoing packets or by sending independent requests.

11. The method of claim 7, further comprising utilizing erasure decoding.

12. The method of claim 7, further comprising storing the retransmit-eligible packets in a receiver queue comprising one of:
 an outlet shaper configured to smooth out delay;
 a rescheduling queue configured to release packets once they are completely reassembled; and
 a pass-thru buffer.

13. The method of claim 7, further comprising receiving retransmitted packets at the receiver, wherein the receiver is configured to request retransmissions one or more times.

14. A protection module in a central office (CO) or a customer premise equipment (CPE) in an xDSL system configured to mitigate the effects of noise, comprising:
 a forward error correction (FEC) module comprising a Reed-Solomon (RS) encoder-decoder and an interleaver-deinterleaver; and
 a retransmission module configured to provide retransmission of corrupted data fragments within the data stream, wherein the FEC module mitigates a first noise and the retransmission module mitigates a second noise, wherein retransmission is performed above a gamma interface of the xDSL system, the gamma interface being an interface above a transmission protocol layer.

15. The protection module of claim 14, wherein the first noise and second noise are characterized based on impulse noise protection value and minimum inter-arrival time.

16. The protection module of claim 14, wherein the FEC module is further configured to perform erasure decoding.

17. The protection module of claim 14, wherein the retransmission module performs retransmission based on a retransmission protocol that supports a plurality of retransmission requests for data eligible for retransmission.

18. The protection module of claim 17, wherein the retransmission protocol further supports retransmission requests for missing sequence identification (SID) numbers and corrupted packets, wherein corrupted packets are determined based on a cyclic redundancy check (CRC).

19. The protection module of claim 17, wherein data is determined to be eligible for retransmission based on corresponding Quality of Service (QoS) requirements.

20. The protection module of claim 14, wherein retransmitted data comprises a time stamp field utilized to manage insertion of retransmitted packets in an outlet shaper buffer to preserve differential delay requirements of an Ethernet bonding protocol.

* * * * *

UNITED STATES PATENT AND TRADEMARK OFFICE
CERTIFICATE OF CORRECTION

PATENT NO. : 8,555,149 B2  
APPLICATION NO. : 12/411511  
DATED : October 8, 2013  
INVENTOR(S) : Pons et al.

Page 1 of 1

It is certified that error appears in the above-identified patent and that said Letters Patent is hereby corrected as shown below:

In the Specification

In Column 7, Line 5, delete "CO 103," and insert -- CO 104, --, therefor.

Signed and Sealed this  
Third Day of December, 2013

Margaret A. Focarino  
*Commissioner for Patents of the United States Patent and Trademark Office*